US012581665B2

(12) United States Patent
Petti et al.

(10) Patent No.: US 12,581,665 B2
(45) Date of Patent: Mar. 17, 2026

(54) BONDED MEMORY MRAM ARRAYS SHARING A COMMON DRIVER CIRCUIT AND METHODS OF MAKING THE SAME

(71) Applicant: WESTERN DIGITAL TECHNOLOGIES, INC., San Jose, CA (US)

(72) Inventors: Christopher Petti, Mountain View, CA (US); Veera Dandu, Albuquerque, NM (US)

(73) Assignee: Sandisk Technologies, Inc., Milpitas, CA (US)

( * ) Notice: Subject to any disclaimer, the term of this patent is extended or adjusted under 35 U.S.C. 154(b) by 346 days.

(21) Appl. No.: 18/453,555

(22) Filed: Aug. 22, 2023

(65) Prior Publication Data

US 2025/0072010 A1     Feb. 27, 2025

(51) Int. Cl.
H10B 80/00        (2026.01)
H01L 23/00        (2006.01)
(Continued)

(52) U.S. Cl.
CPC ............. H10B 80/00 (2023.02); H01L 24/08 (2013.01); H01L 24/80 (2013.01); (Continued)

(58) Field of Classification Search
CPC ........ H10B 80/00; H10B 61/00; H10B 61/22; H01L 24/08; H01L 24/80; H01L 25/0657; H01L 25/18; H01L 25/50; H01L 2224/08145; H01L 2224/80006; H01L 2224/80895; H01L 2224/80896; H01L 2924/1431; H01L 2924/1443; H01L 2225/06541

See application file for complete search history.

(56)                References Cited

U.S. PATENT DOCUMENTS 5,393,352 A     2/1995   Summerfelt
5,915,167 A     6/1999   Leedy
(Continued)

OTHER PUBLICATIONS

Chanthbouala, A. et al., "Solid-state memories based on ferroelectric tunnel junctions," Nature Nanotechnology, vol. 7, pp. 101-104, Feb. 2012, www.nature.com/naturenanotechnology, (2012).
(Continued)

*Primary Examiner* — Hoai V Pham
(74) *Attorney, Agent, or Firm* — THE MARBURY LAW GROUP PLLC

(57)                ABSTRACT

A bonded assembly of a first memory die and a second memory die is provided. The first memory die includes a first two-dimensional memory array of first MRAM cells, first access lines, second access lines, a first driver circuit configured to drive the first access lines, and a second driver circuit configured to drive the second access lines and third access lines. The second memory die includes a second two-dimensional memory array of second MRAM cells, the third access lines, and fourth access lines. Each of the third access lines is electrically connected to a respective one of the second access lines via first electrically conductive paths that extend through a horizontal interface between the first memory die and the second memory die.

15 Claims, 19 Drawing Sheets

(51) Int. Cl.

| | |
|---|---|
| *H01L 25/00* | (2006.01) |
| *H01L 25/065* | (2023.01) |
| *H01L 25/18* | (2023.01) |
| *H10B 61/00* | (2023.01) |

(52) U.S. Cl.
CPC .......... *H01L 25/0657* (2013.01); *H01L 25/18* (2013.01); *H01L 25/50* (2013.01); *H10B 61/00* (2023.02); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/1443* (2013.01)

(56) References Cited

U.S. PATENT DOCUMENTS

| | | | |
|---|---|---|---|
| 6,198,652 | B1 | 3/2001 | Kawakubo et al. |
| 6,246,085 | B1 | 6/2001 | Yoshida |
| 9,941,299 | B1 | 4/2018 | Chen et al. |
| 10,115,897 | B1 | 10/2018 | Sato |
| 10,121,965 | B1 | 11/2018 | Uno et al. |
| 10,199,434 | B1 | 2/2019 | Lee et al. |
| 10,224,372 | B2 | 3/2019 | Mori |
| 10,249,683 | B1 | 4/2019 | Lille et al. |
| 10,256,272 | B2 | 4/2019 | Yoshida et al. |
| 10,283,710 | B2 | 5/2019 | Kikuchi et al. |
| 10,354,728 | B2 | 7/2019 | Rajamohanan et al. |
| 10,355,015 | B2 | 7/2019 | Zhang et al. |
| 10,381,409 | B1 | 8/2019 | Zhou et al. |
| 10,381,411 | B2 | 8/2019 | Lille |
| 10,381,559 | B1 | 8/2019 | Zhou et al. |
| 10,692,884 | B2 | 6/2020 | Cui et al. |
| 10,700,093 | B1 | 6/2020 | Kalitsov et al. |
| 10,741,535 | B1 | 8/2020 | Nishikawa et al. |
| 10,756,106 | B2 | 8/2020 | Nishikawa et al. |
| 10,811,431 | B1 | 10/2020 | Makala et al. |
| 10,833,101 | B2 | 11/2020 | Shimomura et al. |
| 10,868,042 | B1 | 12/2020 | Zhang et al. |
| 10,879,269 | B1 | 12/2020 | Zhang et al. |
| 10,916,287 | B2 | 2/2021 | Zhang et al. |
| 10,923,502 | B2 | 2/2021 | Sato |
| 10,937,809 | B1 | 3/2021 | Sharangpani et al. |
| 10,964,752 | B2 | 3/2021 | Takahashi et al. |
| 10,978,482 | B2 | 4/2021 | Alsmeier et al. |
| 11,043,537 | B2 | 6/2021 | Takahashi et al. |
| 11,049,880 | B2 | 6/2021 | Rajashekhar et al. |
| 11,056,534 | B2 | 7/2021 | Wan et al. |
| 11,088,170 | B2 | 8/2021 | Zhang et al. |
| 11,176,981 | B1 | 11/2021 | Prasad et al. |
| 11,217,289 | B1 | 1/2022 | Prasad et al. |
| 11,322,483 | B1 | 5/2022 | Ogawa et al. |
| 11,501,821 | B2 | 11/2022 | Ogawa et al. |
| 2006/0091437 | A1 | 5/2006 | Hong et al. |
| 2007/0107774 | A1 | 5/2007 | Jin et al. |
| 2016/0005461 | A1 | 1/2016 | Jo et al. |
| 2016/0064391 | A1 | 3/2016 | Li et al. |
| 2016/0359109 | A1 | 12/2016 | Kamimuta et al. |
| 2016/0365133 | A1 | 12/2016 | Ino et al. |
| 2017/0069841 | A1 | 3/2017 | Ino et al. |
| 2018/0233513 | A1 | 8/2018 | Zhang et al. |
| 2018/0277517 | A1 | 9/2018 | Kim et al. |
| 2018/0342557 | A1 | 11/2018 | Mori |
| 2018/0358410 | A1 | 12/2018 | Lee |
| 2018/0374899 | A1 | 12/2018 | Yoshida et al. |
| 2019/0074441 | A1 | 3/2019 | Kikuchi et al. |
| 2019/0088664 | A1 | 3/2019 | Kabuyanagi et al. |
| 2019/0148286 | A1 | 5/2019 | Or-Bach et al. |
| 2019/0189688 | A1 | 6/2019 | Lille |
| 2019/0287599 | A1 | 9/2019 | Higashi et al. |
| 2019/0288192 | A1 | 9/2019 | Takahashi et al. |
| 2019/0354843 | A1 | 11/2019 | Park et al. |
| 2020/0119259 | A1 | 4/2020 | Ahn et al. |
| 2020/0321444 | A1 | 10/2020 | Lien et al. |
| 2020/0365618 | A1 | 11/2020 | Zhang et al. |
| 2020/0411589 | A1 | 12/2020 | Wan et al. |
| 2021/0082955 | A1 | 3/2021 | Rajashekhar et al. |
| 2021/0091204 | A1 | 3/2021 | Rabkin et al. |
| 2021/0159248 | A1 | 5/2021 | Zhang et al. |
| 2021/0210497 | A1 | 7/2021 | Yang et al. |
| 2021/0407943 | A1 | 12/2021 | Rajashekhar et al. |
| 2021/0408019 | A1 | 12/2021 | Makala et al. |
| 2021/0408020 | A1 | 12/2021 | Makala et al. |
| 2021/0408114 | A1 | 12/2021 | Lille et al. |
| 2022/0139441 | A1 | 5/2022 | Ogawa et al. |
| 2023/0060943 | A1* | 3/2023 | Xu ........................ G06F 3/0619 |

OTHER PUBLICATIONS

Benjamin, S. L. et al., "Controlling the nanostructure of bismuth telluride by selective chemical vapour deposition from a single source precursor," J. Mater. Chem. A, 2014, vol. 2, pp. 4865-4869, (2014).

Goh, Y. et al., "Enhanced tunneling electroresistance effects in HfZrO-based ferroelectric tunnel junctions by high-pressure nitrogen annealing," Appl. Phys. Lett., vol. 113, pp. 052905-1-052905-5 (2018); doi: 10.1063/1.5040031, (2018).

Garcia, V. et al., "Ferroelectric tunnel junctions for information storage and processing," Nature Communications, Nature Communications | 5:4289 | DOI: 10.1038/ncomms5289, www.nature.com/naturecommunications, (2014).

Garcia, V. et al., "Giant tunnel electroresistance for non-destructive readout of ferroelectric states," Nature, vol. 460, Jul. 2, 2009, pp. 81-84, doi:10.1038/nature08128, (2009).

Xi, Z. et al., "Giant tunneling electroresistance in metal/ferroelectric/semiconductor tunnel junctions by engineering the Schottky barrier," Nature Communications, vol. 8:15217, pp. 1-9, DOI: 10.1038/ncomms15217, (2016).

De Groot, C. H. et al., "Highly Selective Chemical Vapor Deposition of Tin Diselenide Thin Films onto Patterned Substrates via Single Source Diselenoether Precursors," Chem. Mater. 2012, vol. 24, pp. 4442-4449, (2012).

Wen, Z. et al., "Ferroelectric-field-effect-enhanced electroresistance in metal / ferroelectric / semiconductor tunnel junctions," Nature Materials, vol. 12, pp. 617-621 (2013).

Li, J. et al., "Ultrafast polarization switching in thin-film ferroelectrics," Applied Physics Letters, vol. 84, No. 7, pp. 1174-1176 (2004).

Deguet, C. et al., "Germanium-On-Insulator (GeOI) Structures Realized by the Smart Cut Technology," 2004 IEEE International SOI conference, Oct. 2004, 2 pages, (2004).

Lomenzo, P. D. et al., "Ferroelectric Si-Doped HfO2 Device Properties on Highly Doped Germanium," IEEE Electron Deice Letters, vol. 36, No. 8, pp. 766-768, (2015).

Geiger, R. et al., "Uniaxially stressed germanium with fundamental direct band gap" Cond. Mat. Matl. Sci., 9 pages, (2015).

Li, T. et al., "Origin of Ferroelectricity in Epitaxial Si-Doped HfO2 Films" ACS Appl. Mater. Interfaces 2019, vol. 11, pp. 4139-4144, (2019).

Tian, X. et al., "Evolution of ferroelectric HfO2 in ultrathin region down to 3 nm" Appl. Phys. Lett. 112, 102902 (2018); https://doi.org./10.1063.1.6017094.

Fan, Z. et al., "Ferroelectric HfO2-based materials for next-generation ferroelectric memories" Journal of Advanced Dielectrics, vol. 6, No. 2 (2016) 1630003 (11 pages).

Notification of Transmittal of the International Search Report and the Written Opinion of the International Searching Authority for International Patent Application No. PCTUS2020/067428, mailed on Apr. 29, 2021, 11 pages.

https://technology.discousa.com/solution/sapphire-laser-lift-off/ visited Aug. 20, 2021.

Fichtner, S. et al., "Ferroelectricity in AlScN: Switching, Imprint and sub-150 nm Films," 2020 Joint Conference of the IEEE International Frequency Control Symposium and International Symposium on Applications of Ferroelectrics (IFCS-ISAF) https://arxiv.org/ftp/arxiv/papers/2010/2010.05705.pdf.

(56)  References Cited

OTHER PUBLICATIONS

Fichtner, S. et al., "AlScN: A III-V semiconductor based Ferroelectric," J. Appl. Phys., vol. 125, No. 114103, (2019); https.//doi.org/10.1063/1.6084945.

Max, B. et al., "Ferroelectric Tunnel Junctions based on Ferroelectric-Dielectric Hf0.5Zr0.5O2/Al2O3 Capacitor Stacks," Published in: *2018 48th European Solid-State Device Research Conference* (*ESSDERC*); DOI: 10.1109/ESSDERC.2018.8486882.

Ryu, H.Y. et al., "A comparative study of efficiency droop and internal electric field for InGaN blue lighting-emitting diodes on silicon and sapphire substrates," Scientific Reports, vol. 7, (2017); DOI:10.1038/sreo44814 Corpus ID: 256092.

Paisley, E. A. et al., "Spectroscopic investigations of band offsets of MgOlAlxGa1-xN epitaxial heterostructures with varying AlN content," Appl. Phys. Lett., vol. 107, No. 102101 (2015); https://doi.org/10.1063/1.4930309.

Yazawa, K. et al., "Reduced Coercive Field in Epitaxial Thin Film of Ferroelectric Wurtzite Al0.7Sc0.3N," Appl. Phys. Lett., vol. 118, No. 162903 (2021); https://doi.org/10.1063/5.0043613.

Yamada, N. et al., "Composition-Dependent Properties of Wurtzite-Type Mg1+xSn1-xN2 Epitaxially Grown on GaN(001) Templates," ACS Appl. Electron. Mater., vol. 3, pp. 1341-1349, (2021); https://pubs.acs.org/action/showCitFormats?doi=10.1021/acsaelm.0c01115&ref=pdf.

Hayden, J. et al., "Ferroelectricity in boron-substituted aluminum nitride thin films," Physical Review Materials, vol. 5, No. 044412, (2021); DOI: 10.1103/PhysRevMaterials.5.044412.

Pandey, A. et al., "High-efficiency AlGaN/GaN/AlGaN tunnel junction ultraviolet light-emitting diodes," Photonics Research, vol. 8, Issue 3, pp. 331-337, (2020); https://doi.org/10.1364/PRJ.383652.

Greenaway, A.L. et al., "Ternary Nitride Materials: Fundamentals and Emerging Device Applications," Annual Review of Materials Research, vol. 51, pp. 591-618 (Volume publication date Jul. 2021), First published as a Review in Advance on May 12, 2021, https://doi.org/10.1146/annurey-matsci-080819-012444.

Uhrmann, T., "Advances in Heterogeneous Integration Through Wafer Bonding," Mar. 3, 2015, https://www.3dincites.com/2015/03/advances-heterogeneous-integration-wafer-bonding/.

Yakushiji, K. et al., "Fabrication of a reversal stacking of a magnetic tunnel junction by wafer bonding and thinning technique," Magnetics Society of Japan 2016 conference proceedings 6aA-7 (2016) p. 58, https://www.magnetics.jp/kouenkai/2016/doc/program/6aA-7.pdf.

Yakushiji, K. et al., "Further Technologies for STT-MRAM," Session C4, Proceeding of the 28th Magnetic Recording Conference (TMRC 2017), Aug. 2-4, 2017 Tsukuba, Japan. https://www.nims.go.jp/mmu/tmrc2017/att/C4.pdf.

USPTO Office Communication, Non-Final Office Action for U.S. Appl. No. 16/913,766, mailed May 11, 2022, 26 pages.

USPTO Office Communication, Non-Final Office Action for U.S. Appl. No. 16/913,717, mailed Jun. 8, 2022, 31 pages.

USPTO Office Communication, Final Office Action for U.S. Appl. No. 16/913,717, mailed Oct. 20, 2022, 13 pages.

USPTO Office Communication, Final Office Action for U.S. Appl. No. 16/913,717, mailed Jun. 22, 2023, 13 pages.

U.S. Appl. No. 17/654,760, filed Mar. 14, 2022, SanDisk Technologies LLC.

U.S. Appl. No. 17/654,762, filed Mar. 14, 2022, ScanDisk Technologies LLC.

U.S. Appl. No. 17/654,768, filed Mar. 14, 2022, SanDisk Technologies LLC.

U.S. Appl. No. 17/654,773, filed Mar. 14, 2022, SanDisk Technologies LLC.

U.S. Appl. No. 17/654,777, filed Mar. 14, 2022, SanDisk Technologies LLC.

U.S. Appl. No. 17/654,781, filed Mar. 14, 2022, SanDisk Technologies LLC.

U.S. Appl. No. 17/670,842, filed Feb. 14, 2022, SanDisk Technologies LLC.

U.S. Appl. No. 18/067,998, filed Dec. 19, 2022, SanDisk Technologies LLC.

* cited by examiner

BONDED MEMORY MRAM ARRAYS SHARING A COMMON DRIVER CIRCUIT AND METHODS OF MAKING THE SAME

FIELD

The present disclosure relates generally to the field of memory devices and specifically to a memory device including bonded magnetoresistive random access memory (MRAM) memory arrays sharing a common driver circuit and methods of making the same.

BACKGROUND

The MRAM device can store information employing the difference in electrical resistance of a first configuration in which a ferromagnetic free layer has a magnetization direction that is parallel to the magnetization of a ferromagnetic reference layer and a second configuration in which the free layer has a magnetization direction that is antiparallel to the magnetization of the reference layer. Programming of the MRAM device requires flipping of the direction of the magnetization of the free layer employing an external power source.

SUMMARY

According to an aspect of the present disclosure, a bonded assembly includes a first memory die and a second memory die. The first memory die comprises: a first two-dimensional memory array of first MRAM cells; first access lines electrically connected to a respective row of first MRAM cells within the first two-dimensional memory array; second access lines electrically connected to a respective column of first MRAM cells within the first two-dimensional memory array; a first driver circuit configured to drive the first access lines; and a second driver circuit configured to drive the second access lines and third access lines. The second memory die comprises: a second two-dimensional memory array of second MRAM cells; the third access lines electrically connected to a respective column of second MRAM cells within the second two-dimensional memory array; and fourth access lines electrically connected to a respective row of second MRAM cells within the second two-dimensional memory array. Each of the third access lines is electrically connected to a respective one of the second access lines via first electrically conductive paths that extend through a horizontal bonding interface between the first memory die and the second memory die.

According to another aspect of the present disclosure, a method of forming a bonded assembly is provided. The method comprises: providing a first memory die, wherein the first memory die comprises a first two-dimensional memory array of first MRAM cells, first access lines electrically connected to a respective row of first MRAM cells within the first two-dimensional memory array, second access lines electrically connected to a respective column of first MRAM cells within the first two-dimensional memory array, a first driver circuit configured to drive the first access lines, and a second driver circuit configured to drive the second access lines and third access lines; providing a second memory die, wherein the second memory die comprises a second two-dimensional memory array of second MRAM cells and the third access lines electrically connected to a respective column of second MRAM cells within the second two-dimensional memory array; and bonding the second memory die to the first memory die to form first electrically conductive paths that electrically connects pairs of a respective one of the second access lines and a respective one of the fourth access lines.

DETAILED DESCRIPTION

Figure 1A:
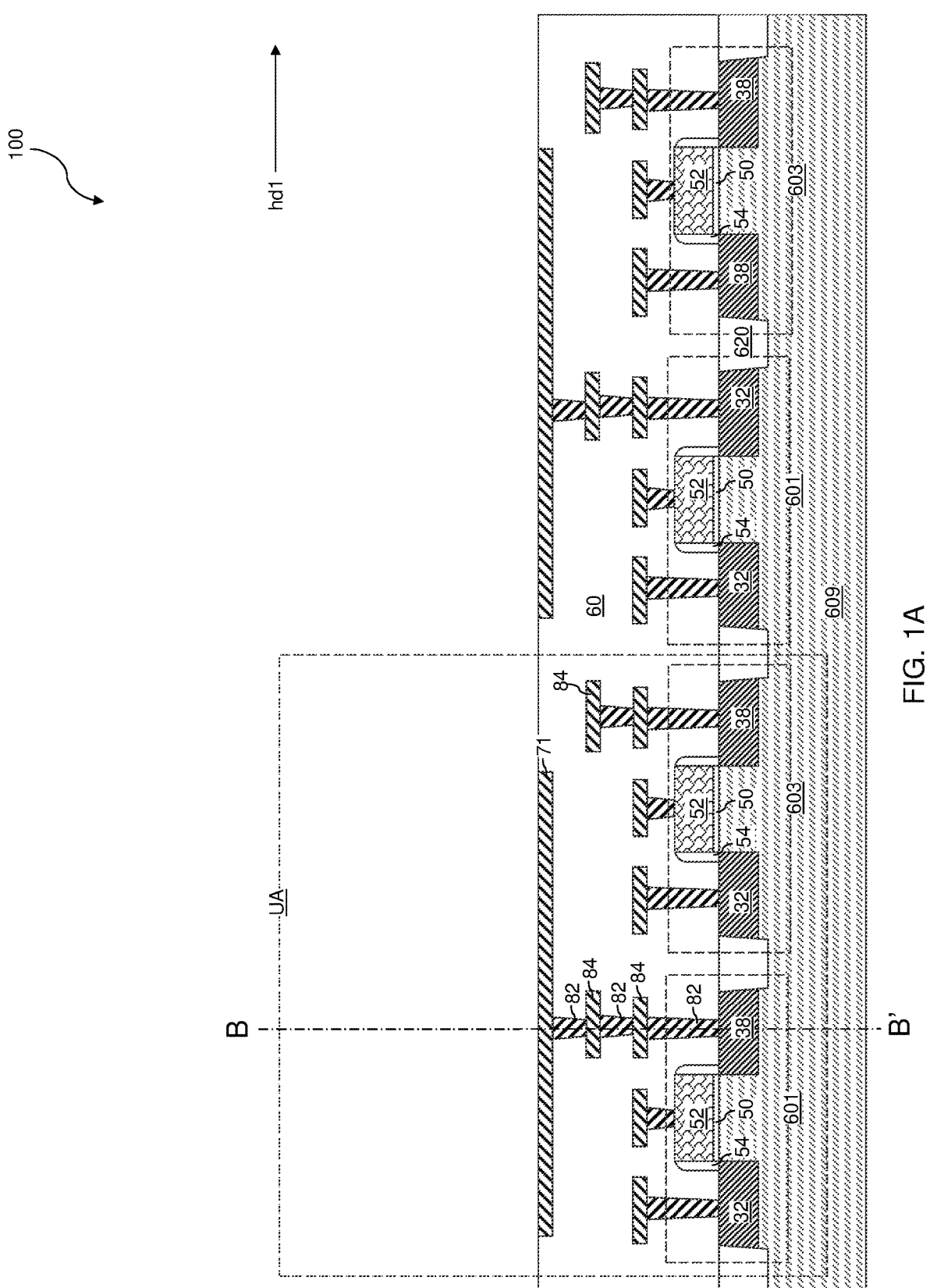
FIG. 1A is a first vertical cross-sectional view of a first memory die after formation of driver circuits, first metal interconnect structures embedded in first dielectric material layers, and first access lines according to an embodiment of the present disclosure.

As discussed above, embodiments of the present disclosure are directed to a memory device including bonded MRAM sharing a common driver circuit and methods of making the same, the various aspects of which are now described with reference to accompanying drawings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Figure 1B:
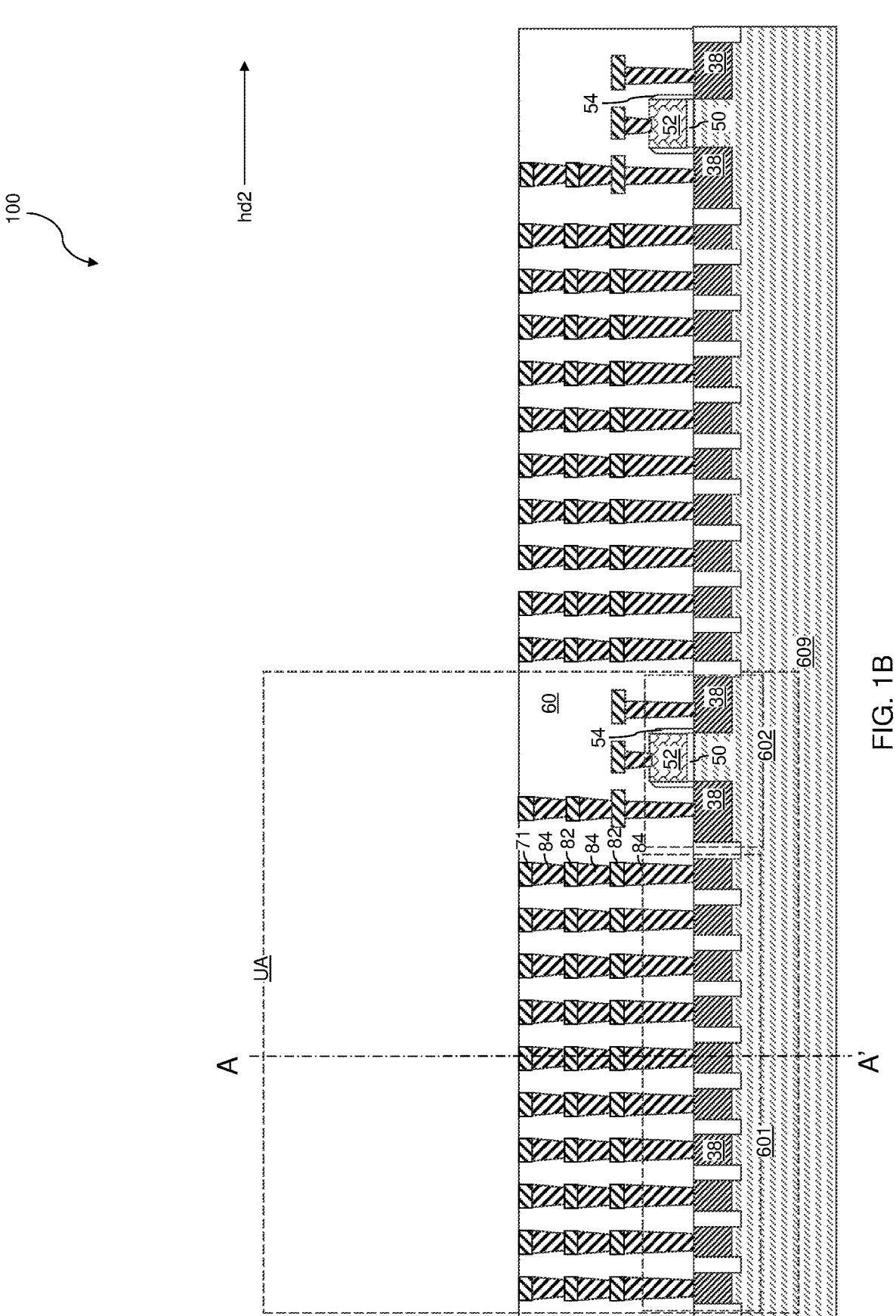
FIG. 1B is a second vertical cross-sectional view of the first memory die along the vertical plane B-B' of FIG. 1A. The vertical plane A-A' is the cut plane for the first vertical cross-sectional view of FIG. 1A.

According to FIGS. 1A and 1B, a first memory die 100 according to an embodiment of the present disclosure is illustrated. The first memory die 100 may comprise a substrate, such as a semiconductor substrate 609, various driver circuits (601, 602, 603) for driving access lines of MRAM arrays to be subsequently formed, first metal interconnect structures (82, 84) embedded in first dielectric material layers 60, and first access lines 71 laterally extending along a first horizontal direction hd1 and embedded in the first dielectric material layers 60.

As used herein, access lines collectively refer to electrically conductive lines that are electrically connected to a respective row of or to a respective column of MRAM cells. In case the MRAM cells comprise portions of respective MRAM pillar structures, the access lines may contact end surfaces (such as bottom surfaces or top surfaces) of a respective row of MRAM pillar structures or a respective column of MRAM pillar structures. Depending on the configurations of the driver circuits, access lines may function as word lines or bit lines. Thus, access lines as used herein collective refer to word lines and bit lines. The access lines may comprise an electrically conductive material, such W, Ta, TiN, etc.

The various driver circuits (601, 602, 603) comprise field effect transistors and other suitable additional semiconductor devices (not expressly shown) located on, in and/or over the semiconductor substrate 609. The field effect transistors may comprise source regions 32, drain regions 38, gate dielectrics 50, gate electrodes 52, and optional dielectric gate sidewall spacers 54. The additional semiconductor device may comprise any type of semiconductor devices known in the art, such as diodes, resistors, capacitors, etc.

The various driver circuits (601, 602, 603) may comprise, for example, first driver circuits 601 configured to drive the first access lines 71, second driver circuits 602 configured to drive second access lines to be subsequently formed in the first memory die 100 and third access lines to be subsequently formed in a second memory die that is different from the first memory die, and third driver circuits 603 configured to drive fourth access lines to be subsequently formed in the second memory die.

The various driver circuits (601, 602, 603) can be configured to enable programming and reading (sensing) operations of the MRAM cells to be subsequently formed in the first memory die 100, and additional MRAM cells to be provided within a second memory die that is bonded to the first memory die 100. The various driver circuits (601, 602, 603) may comprise word line drivers and bit line drivers. The types of circuitry employed for the various driver circuits (601, 602, 603) may be suitably selected based on the type of MRAM cells to be employed in the memory arrays that are subsequently formed in the first memory die 100, or provided in the second memory die to be bonded to the first memory die 100.

For example, if the first access lines 71 comprise word lines, then the first driver circuits 601 may comprise word line drivers (i.e., word line switching circuits) for the word lines 71 of the MRAM cells of the first memory die 100, and second driver circuits 602 may comprise bit line drivers (i.e., bit line switching circuits) for the bit lines of MRAM cells of both the first memory die 100 and the second memory die. The third driver circuits 603 may comprise word line drivers for the word lines of MRAM cells of the second memory die.

The first metal interconnect structures (82, 84) comprise first metal via structures 82 and first metal lines 84. The first metal interconnect structures (82, 84) may comprise any suitable metal or metal alloy, such as copper or copper alloy.

The first metal interconnect structures (82, 84) are configured to provide electrical connections between the electrical nodes (e.g., transistor source regions 32 and drain regions 38) of the various driver circuits (601, 602, 603) and the access lines (e.g., word lines or bit lines) of MRAM cells to be subsequently formed. Further, a subset of the first metal interconnect structures (82, 84) can be configured to provide electrically conductive paths between the third driver circuits 603 and the fourth access lines (e.g., word lines) to be subsequently formed in the second memory die. For example, a subset of the first metal interconnect structures (82, 84) can be electrically connected to drain regions 38 of field effect transistors in the third driver circuits 603.

The first dielectric material layers 60 can include any interlayer dielectric (ILD) material known in the art, which include, for example, undoped silicate glass (i.e., silicon oxide), doped silicate glasses, porous or non-porous silicate glass, dielectric metal oxide materials, silico oxynitride, silicon carbide nitride, etc. The first metal interconnect structures (82, 84) can be formed in the first dielectric material layers 60 employing patterning methods known in the art, which include, but are not limited to, patterning metal layers into the interconnect structures followed by deposition of the first dielectric material layers 60, single damascene metal deposition method in openings in first dielectric material layers 60, dual damascene metal deposition methods in multi-level openings in the first dielectric material layers 60, etc.

The first access lines 71 comprise metal lines that laterally extend along the first horizontal direction (e.g., word line direction) hd1 with a uniform pitch along a second horizontal direction (e.g., bit line direction) hd2 that may be perpendicular to the first horizontal direction hd1. The pitch of the first access lines 71 along the second horizontal direction hd2 may be about twice the width of each first access line 71. The length of the first access lines 71 along the first horizontal direction hd1 is determined by the lateral dimensions of the MRAM cells to be subsequently formed and by a total number of the MRAM cells to be connected to each first access line 71. In an illustrative example, the total number of the MRAM cells to be connected to a first access line 71 may be in a range from 2 to $2^{14}$, although a greater number may also be employed.

The structures formed over the semiconductor substrate 609 may be periodic along the first horizontal direction hd1 and along the second horizontal direction hd2. In this case, the exemplary structure may comprise a two-dimensional periodic repetitions of a unit pattern. The area of each unit pattern is herein referred to as a unit area UA.

Figure 2A:
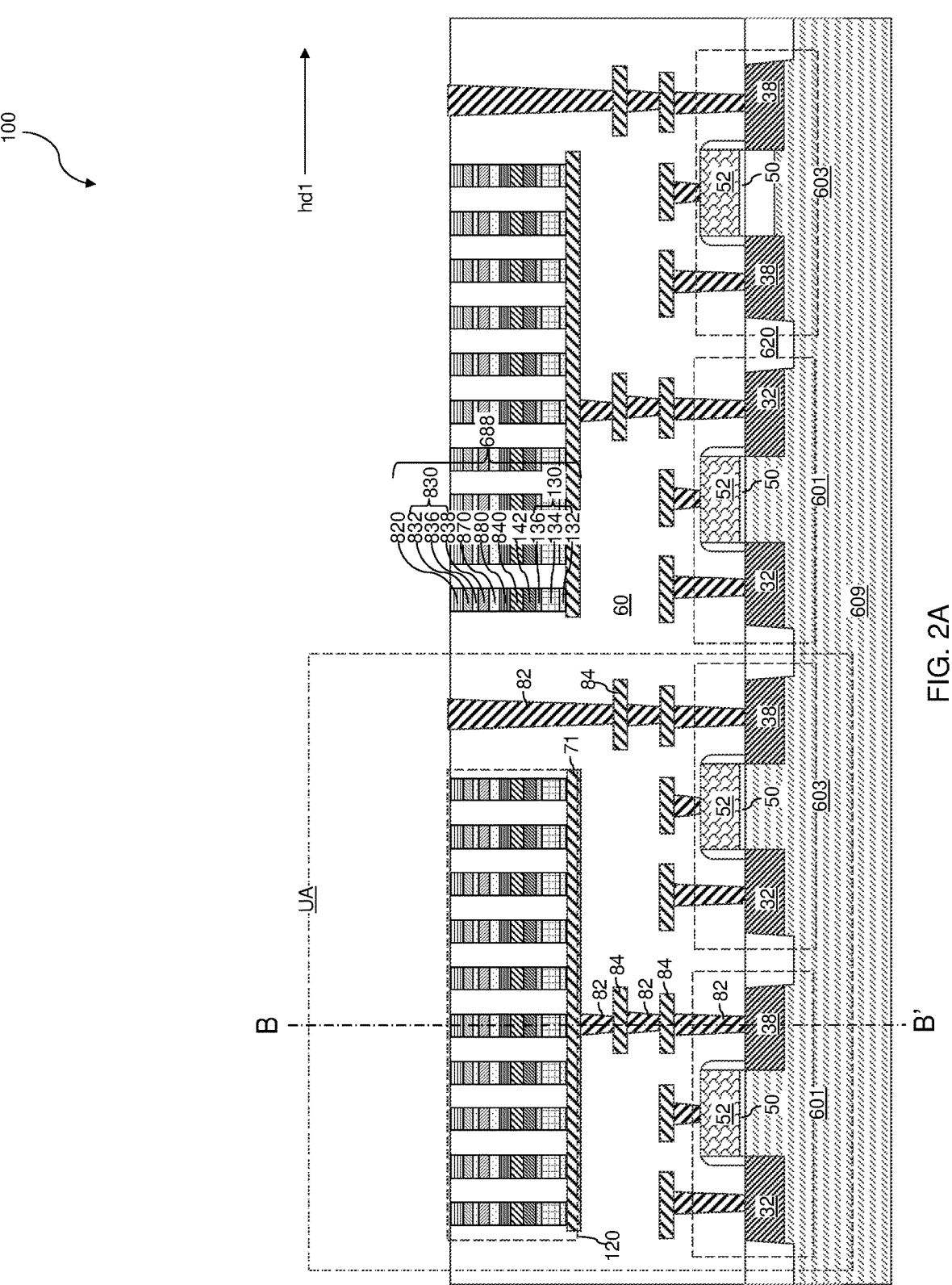
FIG. 2A is a first vertical cross-sectional view of the first memory die after formation of first two-dimensional memory arrays according to an embodiment of the present disclosure.
Figure 2B:
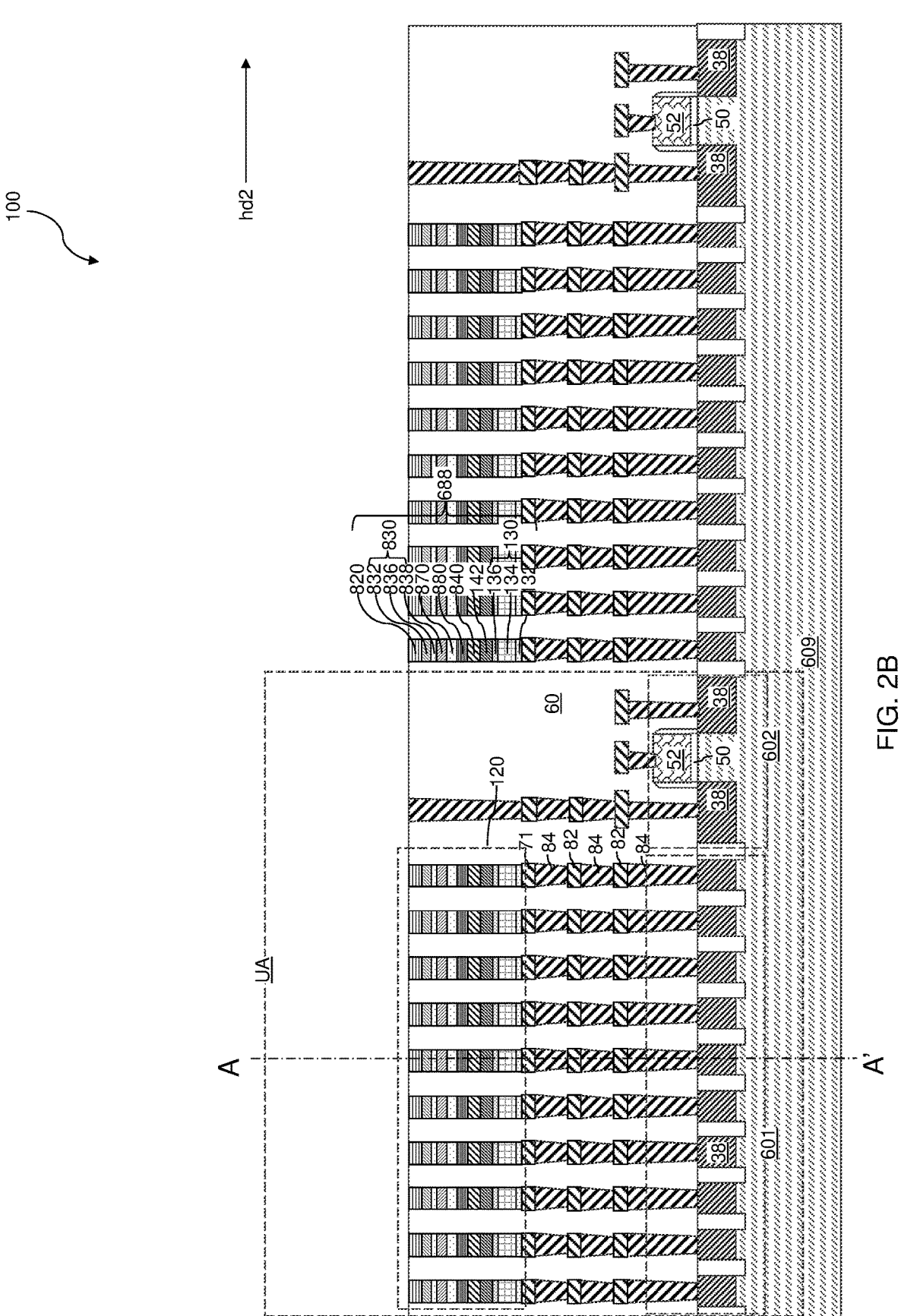
FIG. 2B is a second vertical cross-sectional view of the first memory die along the vertical plane B-B' of FIG. 2A. The vertical plane A-A' is the cut plane for the first vertical cross-sectional view of FIG. 2A.

Referring to FIGS. 2A and 2B, a set of material layers can be deposited as blanket layers, and can be patterned into two-dimensional arrays of MRAM pillar structures 688, which comprise vertical stacks of patterned material portions. A two-dimensional periodic array of MRAM pillar structures 688 can be formed within each unit area UA. Generally, each MRAM pillar structure 688 comprises a MRAM cell 830 that can store at least one data bit.

Any type of two-terminal MRAM cells 830 may be formed in each MRAM pillar structure 688. For example, the MRAM cells 830 may comprise spin-transfer torque (STT) MRAM cells, voltage controlled magnetic anisotropy (VCMA) MRAM cells, etc. For example, a STT MRAM cell 830 may include a magnetic tunnel junction (MTJ) stack containing a ferromagnetic reference layer 832, a ferromagnetic free layer 838 and a tunnel barrier layer 836 located between the ferromagnetic reference layer 832 and the ferromagnetic free layer 838. The ferromagnetic reference and free layers include a ferromagnetic material, such as CoFeB, CoFe, Co, Ni, NiFe, or a combination thereof. The tunnel barrier layer 836 may include any dielectric tunnel barrier material, such as magnesium oxide. The ferromagnetic reference layer 832 may be located above or below the ferromagnetic free layer 838.

A synthetic antiferromagnetic (SAF) structure 820 may be provided adjacent to the side (e.g., top side) of the ferromagnetic reference layer 832 facing away from the tunnel barrier layer 836. The SAF structure 820 pins the magnetization direction of the ferromagnetic reference layer 832. The SAF structure 820 may be located above or below the ferromagnetic reference layer 832 depending on whether the ferromagnetic reference layer 832 is located above or below the ferromagnetic free layer 838, respectively. A dielectric capping layer (e.g., MgO layer) 870 and a non-magnetic metal layer (e.g., Ta or W layer) 880 may optionally be formed above and/or below the MRAM cell 830.

Optionally, each MRAM pillar structure 688 may comprise a selector element 130 that is electrically connected in a series with a respective MRAM cell 830. The selector element 130 may overlie or underlie the MRAM cell 830 within each MRAM pillar structure 688. Each selector element 130 comprises a non-Ohmic material portion 134 that provides a non-Ohmic resistive characteristics as a function of an applied electrical voltage thereacross. For example, the non-Ohmic material portion 134 may comprise an ovonic threshold switch (OTS) material, a conductive bridge material, a diode, or any other non-Ohmic switching material that can switch between different resistivity states upon applications of a voltage that exceeds a threshold voltage. In one embodiment, each selector element 130 may comprise a lower selector electrode 132 that underlies the non-Ohmic material portion 134, and an upper selector electrode 136 that overlies the non-Ohmic material portion 134. Each of the lower selector electrode 132 and the upper selector electrode 136 may comprise a respective a non-metallic and/or metallic conductive material. Exemplary non-metallic conductive materials that can be employed for the lower selector electrode 132 and the upper selector electrode 136 include amorphous carbon, amorphous boron-doped carbon, amorphous nitrogen-doped carbon, etc.

Optional intermediate conductive layers (142, 840) may be formed between the MRAM cell 830 and the selector element 130. Such optional intermediate conductive layers (142, 840) may comprise an intermediate non-magnetic metallic plate (e.g., TiN, Ta or W plate) 142 and/or a non-magnetic metal seed layer (e.g., Ta or Pt) 840.

A first two-dimensional memory array 120 of first MRAM cells 830 can be formed within each unit area UA. Within each unit area UA, the first access lines 71 are electrically connected to a respective row of first MRAM cells 830 within the first two-dimensional memory array 120. Within each unit area UA, the first access lines (e.g., word lines) 71 can contact first end surfaces of a respective row of first MRAM pillar structures 688 within the first two-dimensional memory array 120. Each first driver circuit (e.g., word line driver) 601 is configured to drive a respective set of first access lines 71 in a respective unit area UA.

Figure 3A:
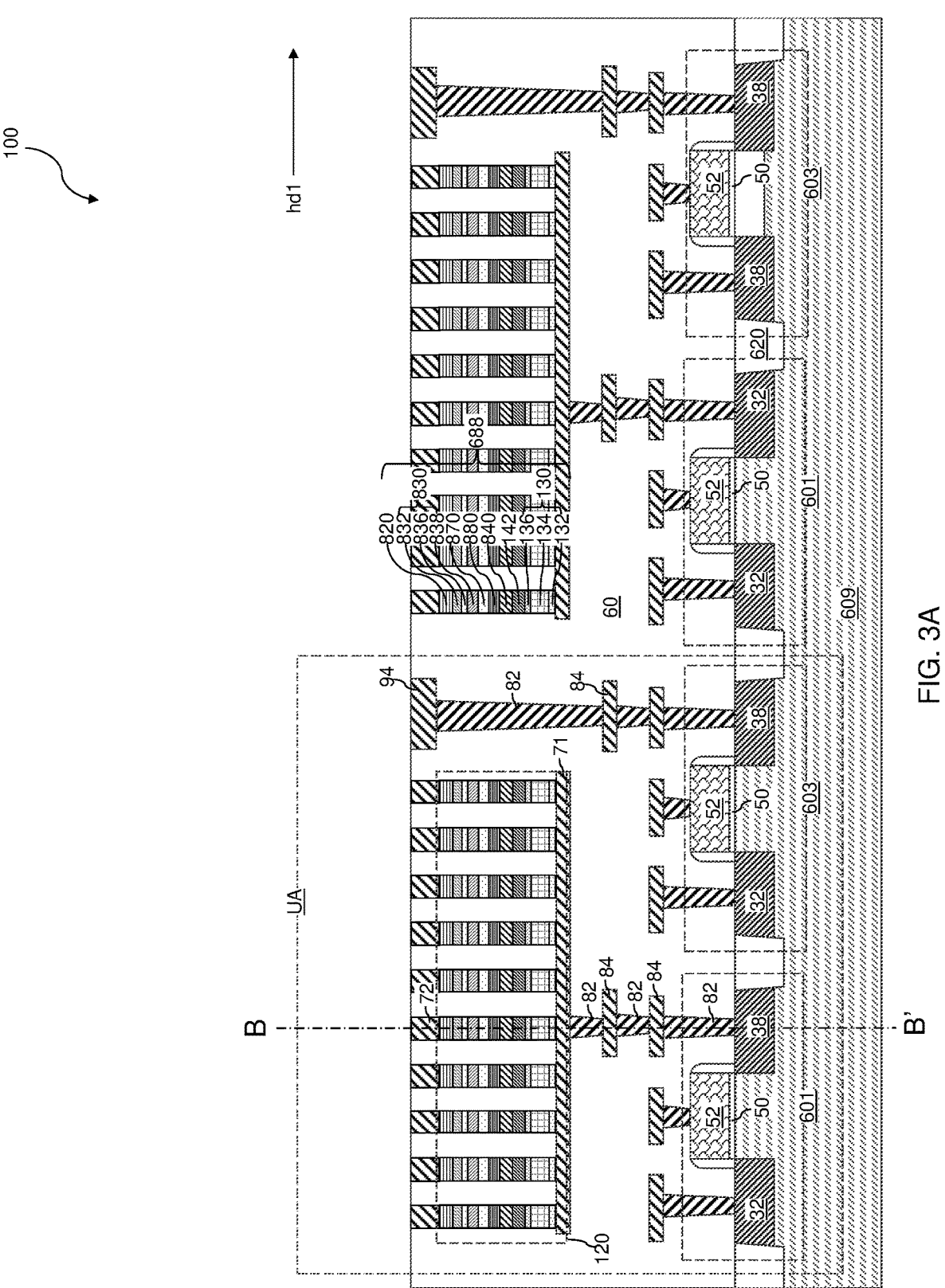
FIG. 3A is a first vertical cross-sectional view of the first memory die after formation of additional first metal interconnect structures according to an embodiment of the present disclosure.
Figure 3B:
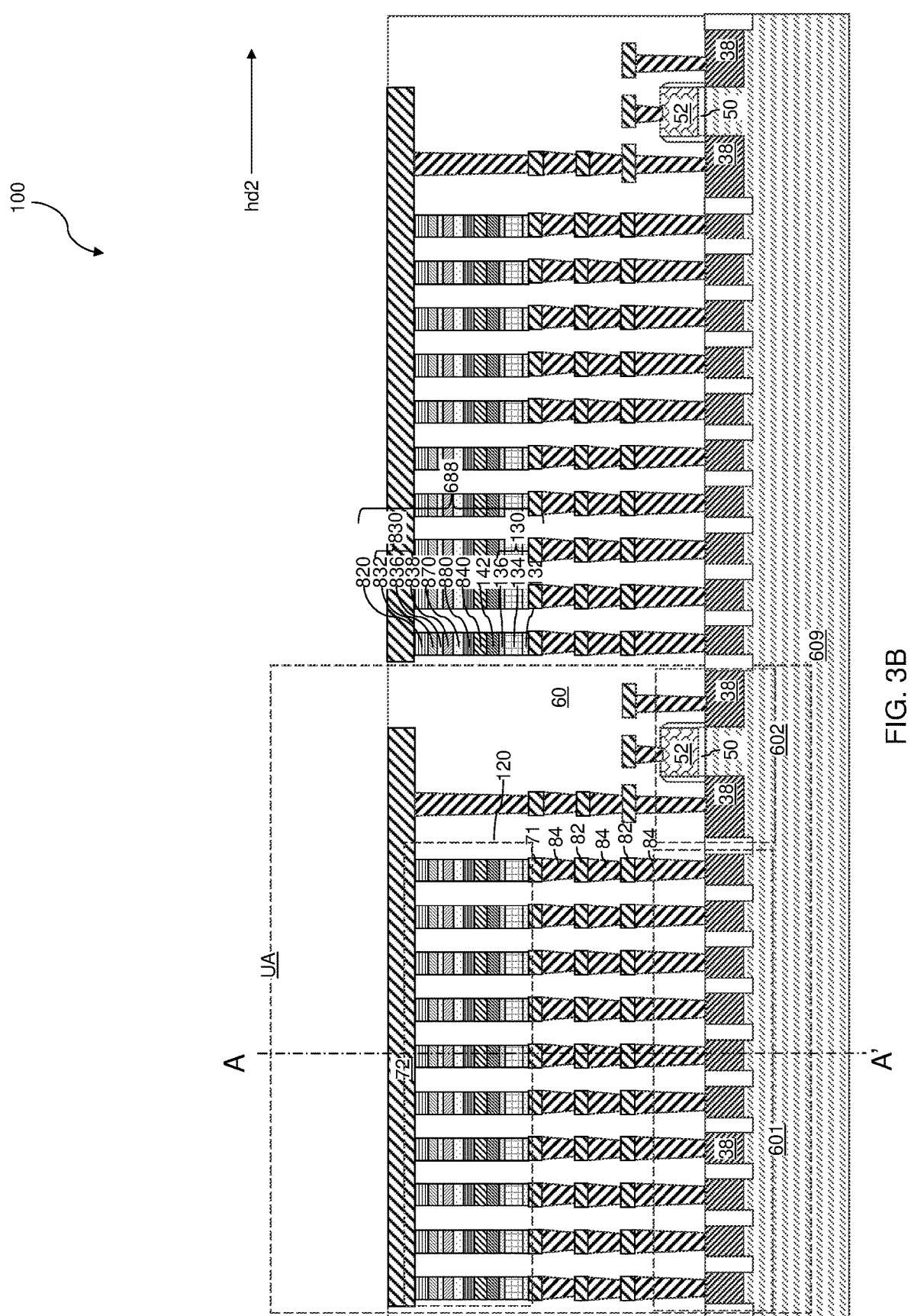
FIG. 3B is a second vertical cross-sectional view of the first memory die along the vertical plane B-B' of FIG. 3A. The vertical plane A-A' is the cut plane for the first vertical cross-sectional view of FIG. 3A.

Referring to FIGS. 3A and 3B, an additional first dielectric material layer 60 can be formed over the first two-dimensional memory arrays 120 of first MRAM cells 830, and can be incorporated into the first dielectric material layers 60 in the first memory die 100. Second access lines 72 can be formed over the first two-dimensional memory arrays 120 of first MRAM cells 830. The second access lines 72 may be formed by depositing a conductive layer (W, Ta, TiN, etc.) over the first MRAM pillar structures 688, followed by photolithographic patterning and etching of the conductive layer to form the second access lines 72. The additional first dielectric material layer 60 can be formed over the second access lines 72. Alternatively, the additional first dielectric material layer 60 can be formed first, followed by forming openings in the additional first dielectric material layer 60 and forming the second access lines 72 in the openings using a damascene process.

The second access lines 72 can laterally extend along the second horizontal direction (e.g., bit line direction) hd2, and can contact top surfaces of a respective column of MRAM pillar structures 688. Each second access line 72 may be electrically connected to a respective column of MRAM cells 830. Further, each second access line 72 can be formed on a top surface of a respective first metal interconnect structure (82, 84) that is electrically connected to a respective electrical node of a second driver circuit 602.

In one embodiment, the second access lines 72 may comprise bit lines that are electrically connected to a respective column of first MRAM cells 830 within a respective first two-dimensional memory array 120. The second driver circuit (e.g., bit line driver) 602 can be electrically connected to the second access lines 72 through a subset of the first metal interconnect structures (82, 84), and can be configured to drive the second access lines 72. Each MRAM cell 830 can be accessed by a combination of a respective first access line (e.g., word line) 71 and a respective second access line (e.g., bit line) 72. Additional first metal interconnect structures (82, 84) that are electrically connected to the third driver circuits 603 may be formed in the first dielectric material layers 60.

In one embodiment, a column of first metal pads 94 may be formed adjacent to each first two-dimensional memory array 120. In one embodiment, the columns of first metal pads 94 may be formed concurrently with formation of the second access lines 72, and may have top surfaces within a horizontal plane including the top surfaces of the second access lines 72. In one embodiment, each first metal pad 94 within the columns of first metal pads 94 may be electrically connected to an electrical node (e.g., source region 32 or drain region 38) of a respective field effect transistor within a respective third driver circuit 603.

Figure 4A:
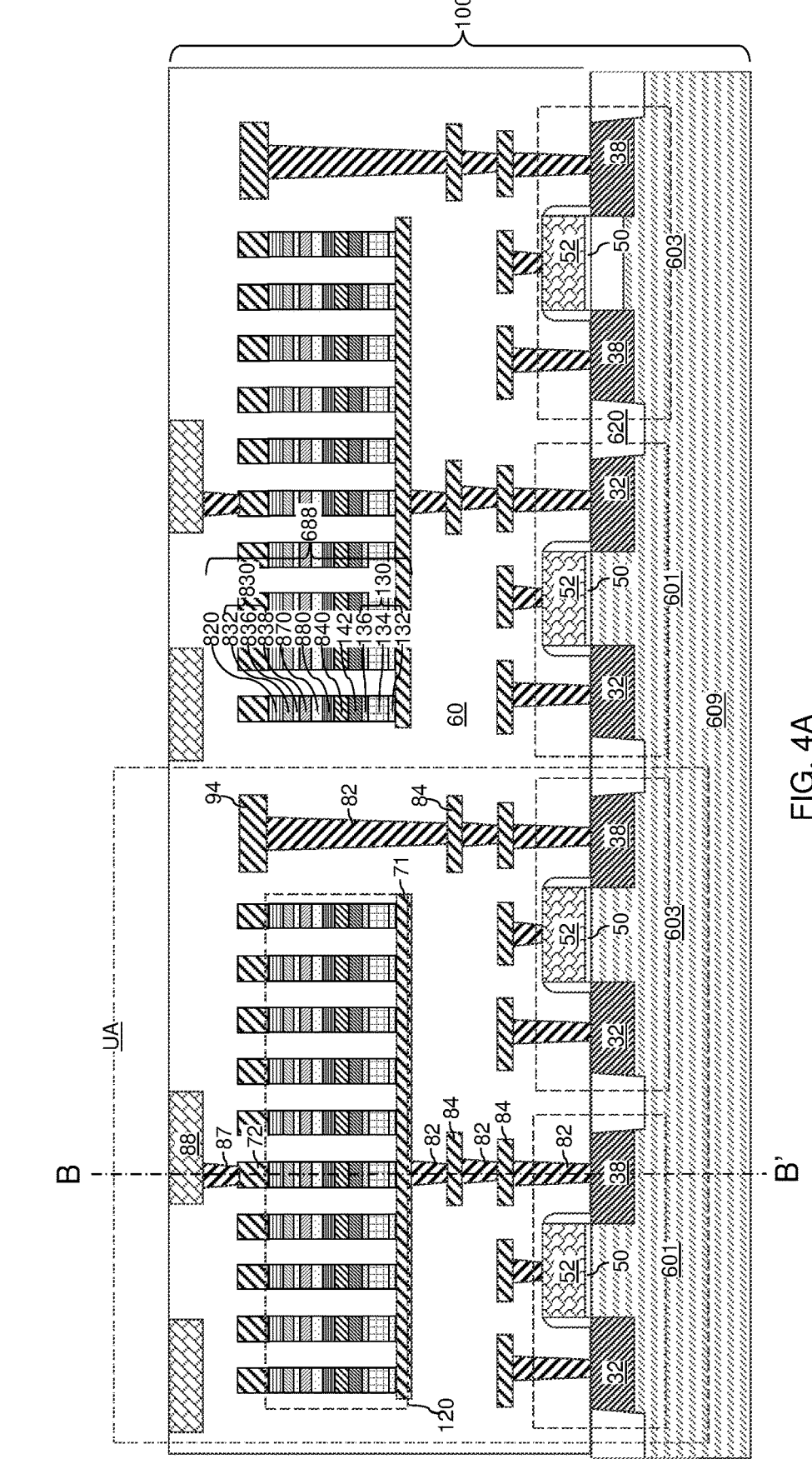
FIG. 4A is a first vertical cross-sectional view of the first memory die after formation of additional first dielectric material layers, yet additional first metal interconnect structures, and first metal bonding pads according to an embodiment of the present disclosure.
Figure 4B:
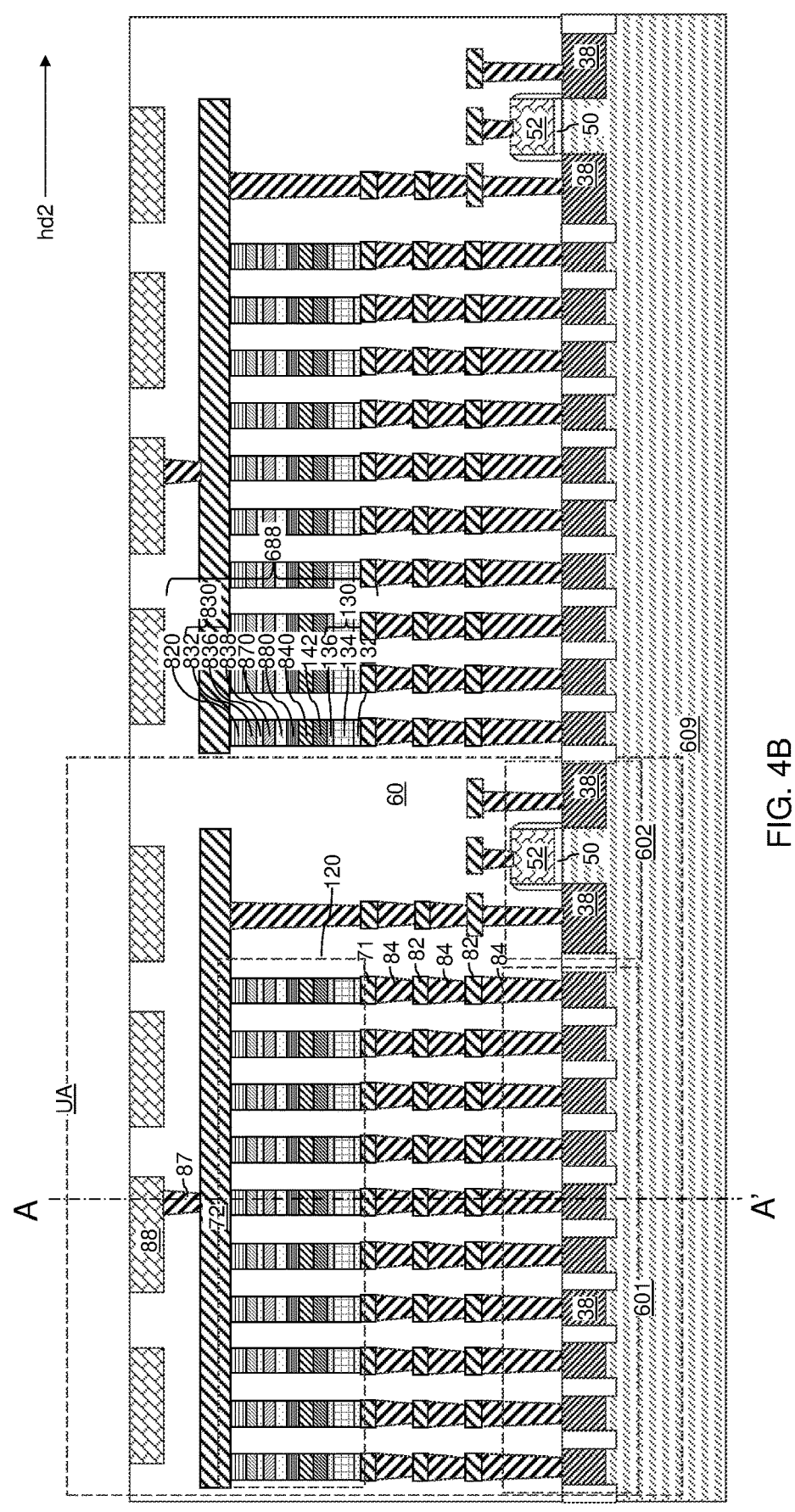
FIG. 4B is a second vertical cross-sectional view of the first memory die along the vertical plane B-B' of FIG. 4A. The vertical plane A-A' is the cut plane for the first vertical cross-sectional view of FIG. 4A.
Figure 4C:
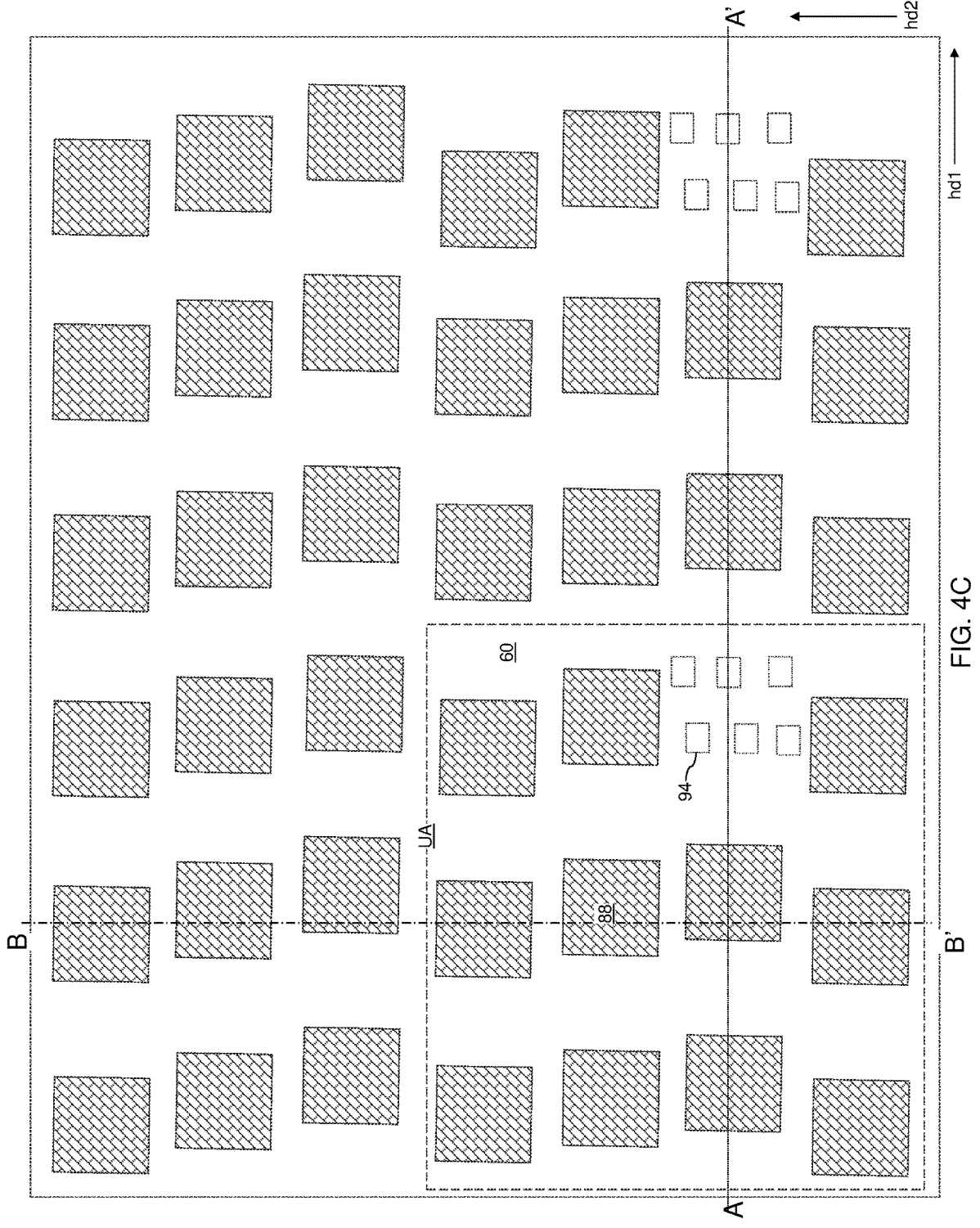
FIG. 4C is a top-down view of the first memory die of FIGS. 4A and 4B.

Referring to FIGS. 4A-4C, additional first dielectric material layers 60, additional first metal interconnect structures 87, and first metal bonding pads 88 can be formed. In one embodiment, the additional first dielectric material layers 60 may comprise a via-level dielectric material layer in which first metal via structures 87 can be formed as the additional first metal interconnect structures, and a first bonding-level dielectric material layer in which the first metal bonding pads 88 can be formed. The first metal bonding pads 88 comprises a metal, such as copper, that may be employed for metal-to-metal bonding. In one embodiment, the first metal via structures 87 may contact a horizontal surface of one of the second access lines 72, and the first metal bonding pads 88 may be formed on a top surface of a respective one of the first metal via structures 87. Thus, each of the second access lines 72 may be electrically connected to a respective one of the first metal bonding pads 88 through a respective first metal via structure 87. The first metal bonding pads 88 within each unit area UA may be arranged as a two-dimensional array, which may comprise a periodic two-dimensional array.

The first memory die 100 may be provided on a semiconductor substrate 609 (e.g., silicon wafer) which includes a two-dimensional array of memory dies 100, or as a discrete first memory die 100 that has been diced from the original growth wafer. The first memory die 100 comprises a first two-dimensional memory array 120 of first MRAM cells 830, first access lines 71 electrically connected to a respective row of first MRAM cells 830 within the first two-dimensional memory array 120, second access lines 72 electrically connected to a respective column of first MRAM cells 830 within the first two-dimensional memory array 120, a first driver circuit 601 configured to drive the first access lines 71, and a second driver circuit 602 configured to drive the second access lines 72. In one embodiment, a first memory die 100 may comprise multiple unit areas UA, and may comprise multiple first two-dimensional memory arrays 120 located within a respective one of the multiple unit areas UA.

Referring to FIG. 4C, the first metal pads 94 may be embedded in the first dielectric material layers 60 in areas that are not located below the first metal bonding pads 88. Thus, the first metal bonding pads 88 do not overlap the first metal pads 94 in the vertical direction. It should be noted that while only several first metal bonding pads 88 are shown for clarity, the number of first metal bonding pads 88 in the unit area UA is preferably equal to the number of the second access lines 72 that traverse the unit area UA.

Figure 5A:
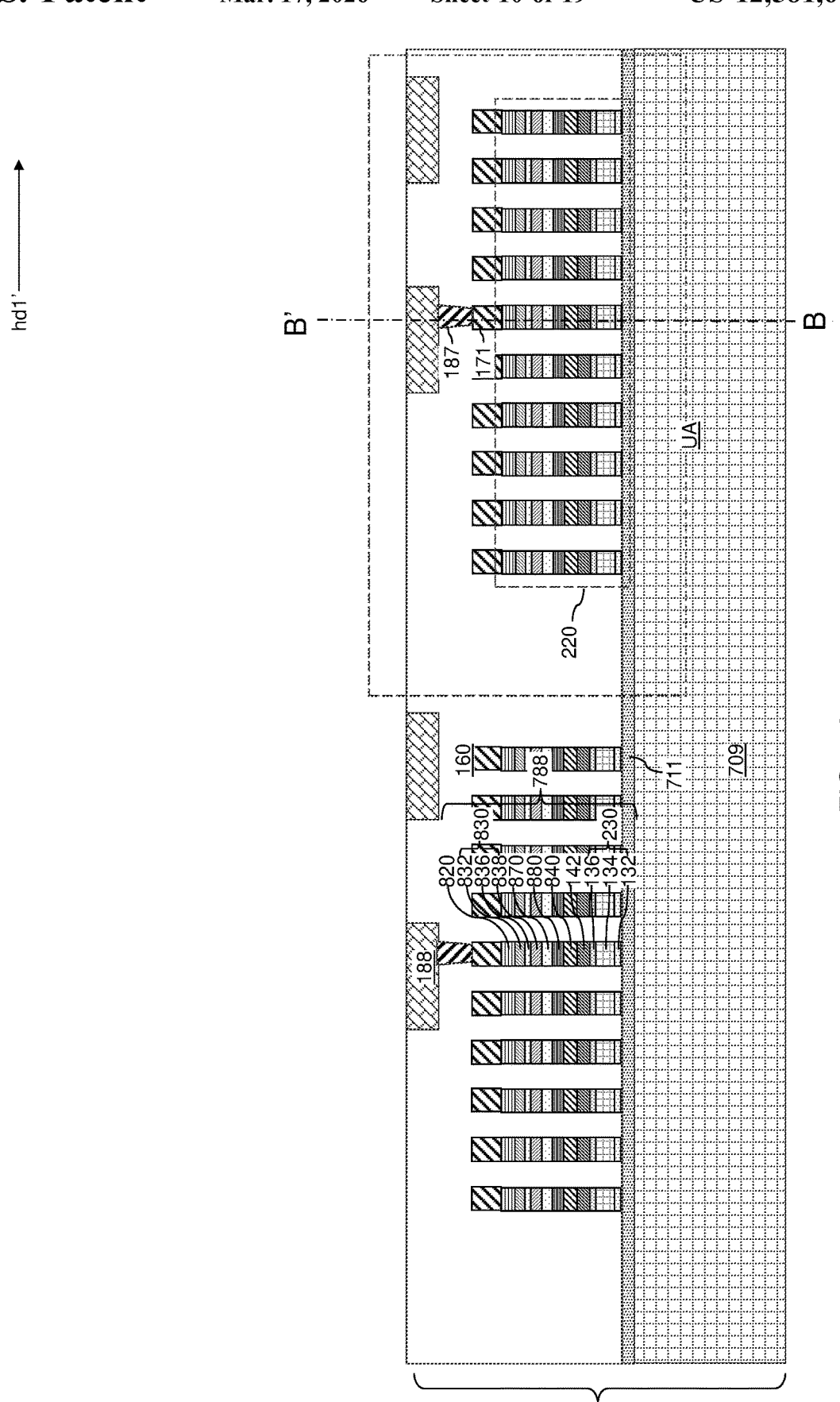
FIG. 5A is a first vertical cross-sectional view of a second memory die after formation of second two-dimensional memory arrays, third access lines, second metal interconnect structures embedded in second dielectric material layers, and second metal bonding pads according to an embodiment of the present disclosure.
Figure 5B:
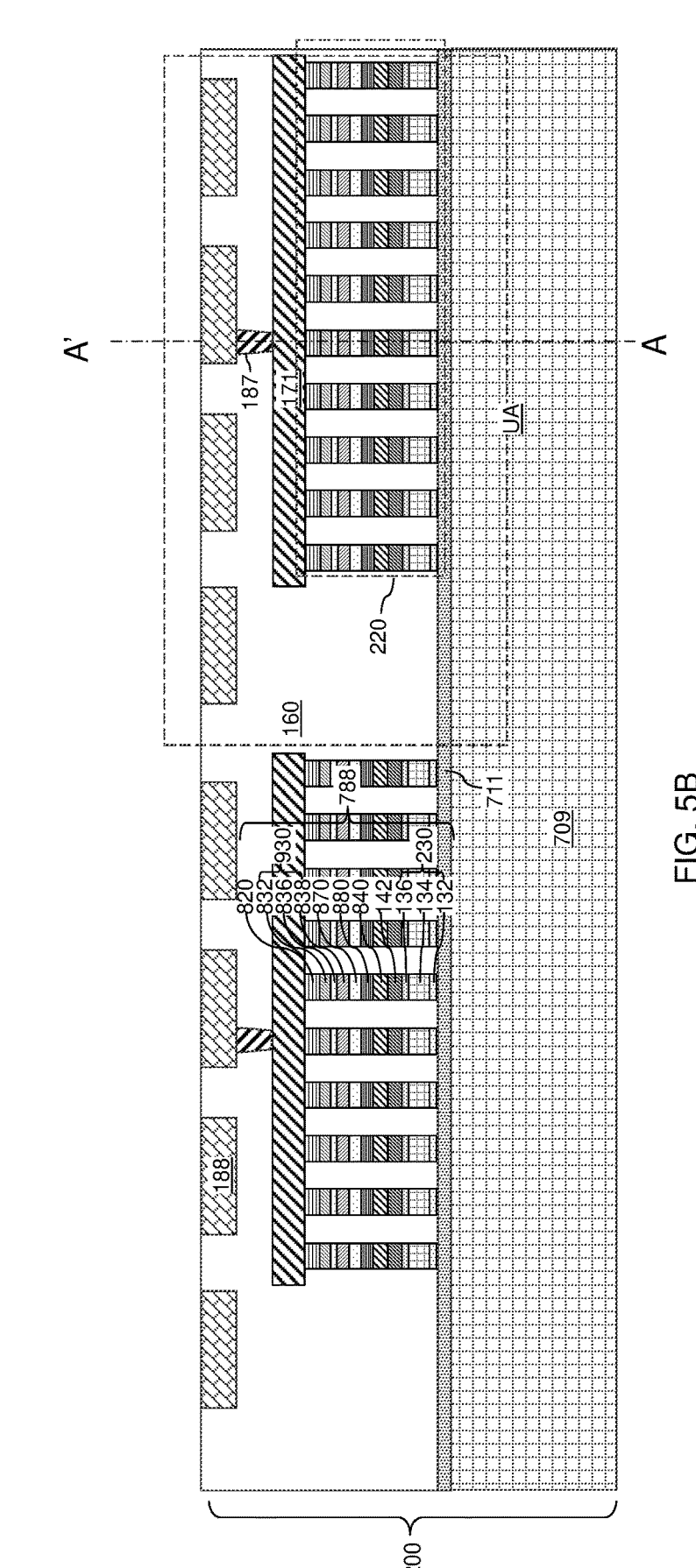
FIG. 5B is a second vertical cross-sectional view of the second memory die along the vertical plane B-B' of FIG. 5A. The vertical plane A-A' is the cut plane for the first vertical cross-sectional view of FIG. 5A.

Referring to FIGS. 5A and 5B, a second memory die 200 can be provided, which comprises a carrier substrate 709, an optional release layer 711 located on a top surface of the carrier substrate 709, second two-dimensional memory arrays 220 of second MRAM pillar structures 788 (each including a respective second MRAM cell 930) formed within a respective unit area UA, third access lines 171 contacting top surfaces of a respective column of second MRAM pillar structures 788, second metal interconnect structures 187 embedded in second dielectric material layers 160, and second metal bonding pads 188 electrically connected to a respective one of the third access lines 171 through a respective subset of the second metal interconnect structures 187. The second metal interconnect structures 187 may comprise a second metal via structure 187 contacting a horizontal surface of one of the third access lines 171 and contacting a horizontal surface of a respective one of the second metal bonding pads 188. The topmost layer of the second dielectric material layers 160 may comprise a dielectric material that may be bonded to another dielectric material by dielectric-to-dielectric bonding. For example, the topmost layer of the second dielectric material layers 160 may comprise silicon oxide.

The carrier substrate 709 may comprise any substrate that may be removed from the overlying second two-dimensional memory arrays 220 of second MRAM pillar structures 788. The carrier substrate 709 may comprise a semiconductor substrate (such as a commercially available silicon wafer), or may comprise an insulating substrate (such as a glass substrate or a sapphire substrate), a conductive substrate, or a composite substrate. The optional release layer 711 may comprise a thermally-decomposable polymer material or a light-to-heat conversion (LTHC) polymer material that can be subsequently decomposed upon subsequent absorption of ultraviolet light, or a polymer or inorganic (e.g., silicon nitride) material that may be subsequently dissolved in a solvent that does not dissolve the materials of the second two-dimensional memory arrays 220 of second MRAM pillar structures 788 that are in contact with the release layer 711.

Each of the third MRAM cells 930 within a second two-dimensional memory array 220 may be in a series connection with a respective second selector element 230. In one embodiment, the two-dimensional memory arrays 220 of the second MRAM pillar structures 788 may by the same as the first two-dimensional arrays of 120 of the first MRAM pillar structures 688.

The third access lines 171 may be laterally spaced apart along a first horizontal direction hd1, and may laterally extend along a second horizontal direction hd2'. The pitch of the third access lines 171 along the first horizontal direction hd1' may be the same as the pitch of the second access lines 72 along the first horizontal direction hd1.

Generally, a second memory die 200 may be provided within a two-dimensional array of memory dies 100 that share a carrier substrate 709, or as a discrete memory die including discrete carrier substrate 709. The second memory die 200 comprises a second two-dimensional memory array 220 of second MRAM cells 930 and third access lines 171 electrically connected to a respective column of second MRAM cells 930 within the second two-dimensional memory array 220.

Figure 6A:
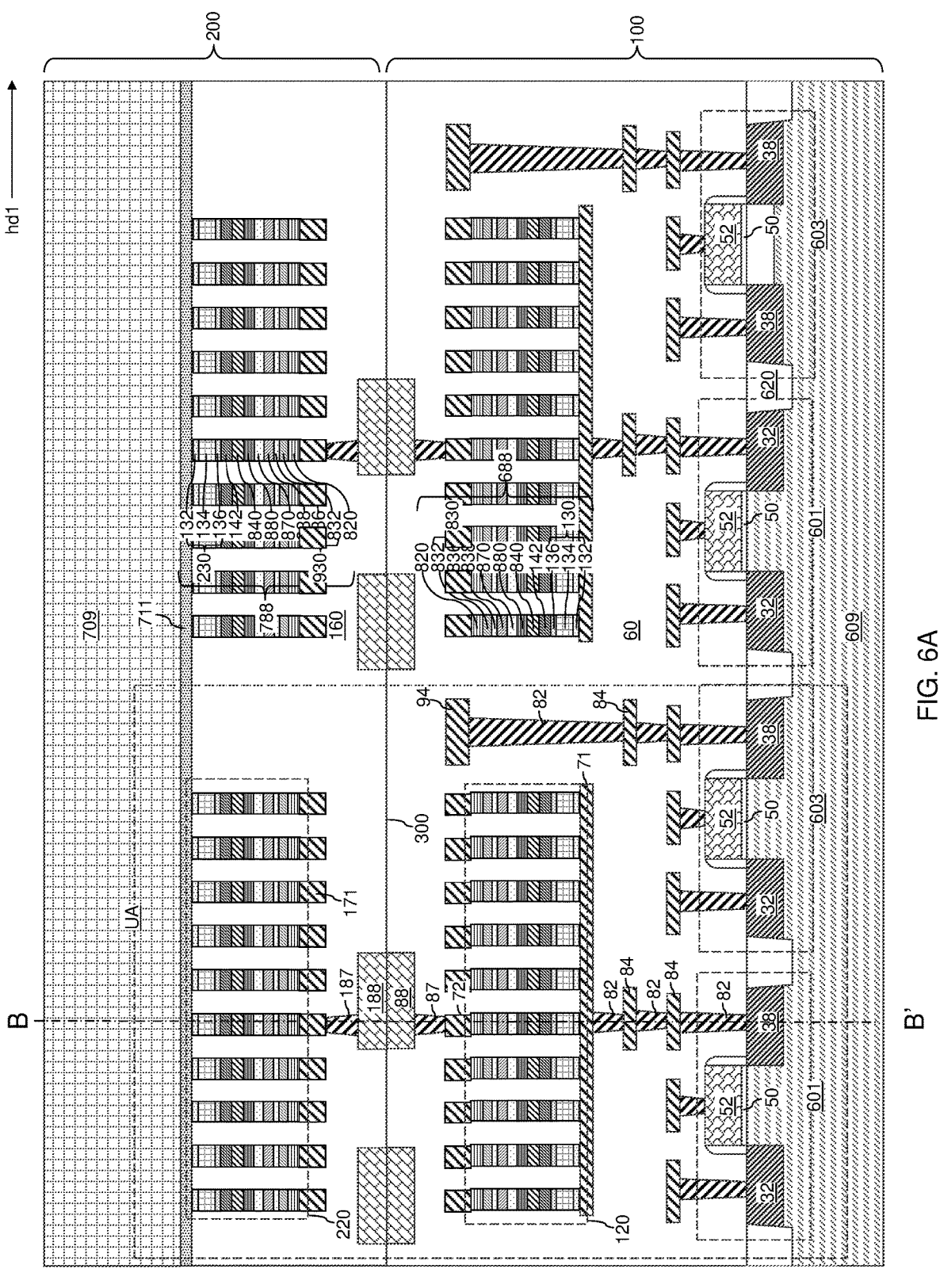
FIG. 6A is a first vertical cross-sectional view of a bonded assembly formed by bonding the second memory die to the first memory die according to an embodiment of the present disclosure.
Figure 6B:
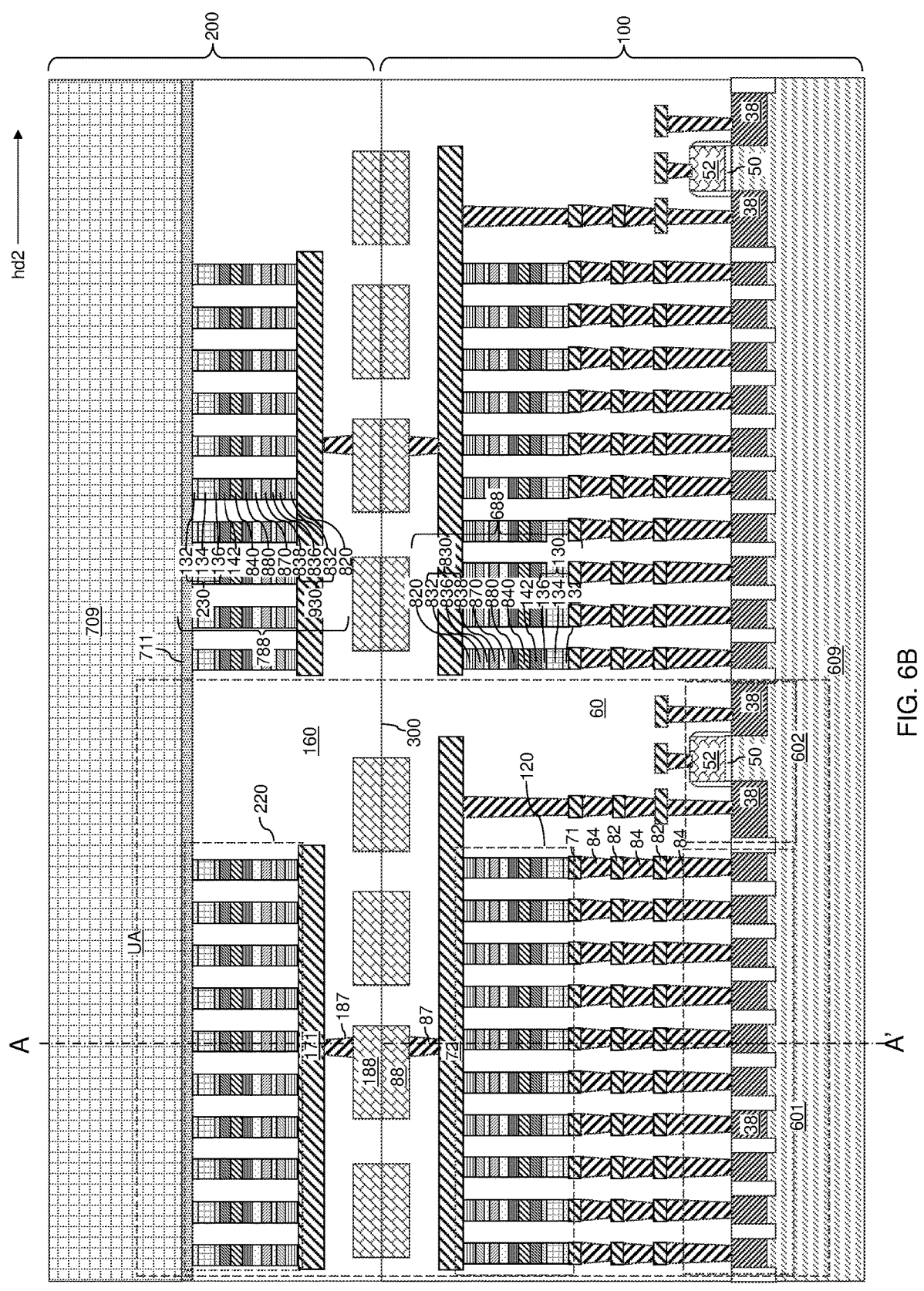
FIG. 6B is a second vertical cross-sectional view of the bonded assembly along the vertical plane B-B' of FIG. 6A. The vertical plane A-A' is the cut plane for the first vertical cross-sectional view of FIG. 6A.

Referring to FIGS. 6A and 6B, the second memory die 200 can be bonded to the first memory die 100 by aligning the second metal bonding pads 188 to the first metal bonding pads 88, by bringing the second memory die 200 in contact with the first memory die 100, and by performing an anneal process that induces metal-to-metal bonding between each mating paid of a first metal bonding pad 88 and a second metal bonding pad 188.

After bonding the second MRAM pillar structures 788 are positioned upside down relative to the first MRAM pillar structures 688 and have a mirror symmetry across a bonding interface 300 between the first memory die 100 and the second memory die 200. The order of the material layers along the vertical direction within each second MRAM pillar structure 788 may be opposite of the order of the material layers along the vertical direction within a first MRAM pillar structure 688 after the bonding step. Thus, if the first selector element 130 is located below the respective first MRAM cell 830 within a respective first MRAM pillar structure 688, then the second selector element 230 may be located above the respective second MRAM cell 930 within a respective second MRAM pillar structure 788.

The shape of each unit area UA in the second memory die 200 may be a mirror image of each unit area UA in the first memory die 100 across the bonding interface 300 between the first memory die 100 and the second memory die 200. In case a horizontal cross-sectional shape of the unit area UA in the first memory die 100 has a mirror symmetry (as in the case of a rectangular shape), the shape of the unit area UA in the second memory die 200 may be the same as the shape of the unit area UA of the first memory die 100. The pattern of the second metal bonding pads 188 is a mirror image pattern of the pattern of the first metal bonding pads 88 in the first memory die 100.

In one embodiment, the first metal bonding pads 88 and the second metal bonding pads 188 may consist essentially of copper, and the metal-to-metal bonding process may comprise a copper-to-copper bonding process. In another embodiment, the first metal bonding pads 88 and the second metal bonding pads 188 may comprise a solder material, such as a tin containing solder (e.g., a tin-copper alloy solder), and the metal-to-metal bonding process may comprise a solder bonding process. The elevated temperature of the anneal process that bonds the mating pairs of the first metal bonding pads 88 and the second metal bonding pads 188 may be in a range from 250 degrees Celsius to 400 degrees Celsius, although lower and higher temperatures may also be employed.

In one embodiment, a topmost layer of the first dielectric material layers 60 and a bottommost layer of the second dielectric material layers 160 (while the second memory die 200 is oriented upside down) can contact each other, and dielectric-to-dielectric bonding may occur between the first dielectric material layers 60 and the second dielectric material layers 160. For example, a first silicon oxide layer within the first dielectric material layers 60 and a second silicon oxide layer within the second dielectric material layers 160 may be bonded to each other to provide silicon oxide-to-silicon oxide bonding between the first dielectric material layers 60 and the second dielectric material layers 160. Thus, the bonding between the first and second memory die may comprise hybrid (i.e., metal and dielectric) bonding.

A bonded assembly (100, 200) can be formed by bonding the second memory die 200 to the first memory die 100. Generally, the bonded assembly (100, 200) may be formed by a wafer-to-wafer bonding process, a wafer-to-die bonding process, or a die-to-die bonding process. A first wafer including a two-dimensional array of first memory dies 100 can be bonded to a wafer including a two-dimensional array of second memory dies 200 in a wafer-to-wafer bonding process. A wafer including a two-dimensional array of first memory dies 100 can be bonded to a plurality of discrete second memory dies 200, or a plurality of discrete first memory dies 100 can be bonded to a wafer including a two-dimensional array of second memory dies 200 in a wafer-to-die bonding process. A discrete first memory die 100 can be bonded to a discrete second memory die 200 in a die-to-die bonding process.

Within each bonded assembly (100, 200), third access lines 171 can be electrically connected to a respective column of third MRAM cells 930 within the second two-dimensional memory array 220, and each of the third access lines 171 can be electrically connected to a respective one of the second access lines 72 via first electrically conductive paths that extend through a horizontal interface between the first memory die 100 and the second memory die 200. In one embodiment, each of the first electrically conductive paths comprises a first metal bonding pad 88 embedded within the first memory die 100, and a second metal bonding pad 188 embedded within the second memory die 200 and bonded to the first metal bonding pad 88. In one embodiment, each of the first electrically conductive paths comprises at least one first metal interconnect structure (such as a first metal via structure 87) embedded in first dielectric material layers 60 within the first memory die 100 and contacting the first metal bonding pad 88, and at least one second metal interconnect structure (such as a second metal via structure 187) embedded in second dielectric material layers 160 within the second memory die 200 and contacting the second metal bonding pad 188. In one embodiment, a horizontal surface of the first dielectric material layers 60 is bonded to a horizontal surface of the second dielectric material layers 160 at the bonding interface 300 via dielectric-to-dielectric bonding.

In summary, first electrically conductive paths that electrically connect pairs of a respective one of the second access lines 72 and a respective one of the third access lines 171 can be formed by bonding the second memory die 200 to the first memory die 100. Each of the third access lines 171 is electrically connected to a respective one of the second access lines 72 via a first electrically conductive path that extends through a horizontal bonding interface 300 between the first memory die 100 and the second memory die 200. For example, if the second access lines 72 and the third access lines 171 comprise respective bit lines of the first and second two-dimensional memory arrays (120, 220), then a pair of bit lines (72, 171) in different arrays (120, 220) may be driven by the same second driver circuit (e.g., bit line driver) 602. This decreases the number of driver circuit needed to drive two different MRAM memory arrays.

Figure 7A:
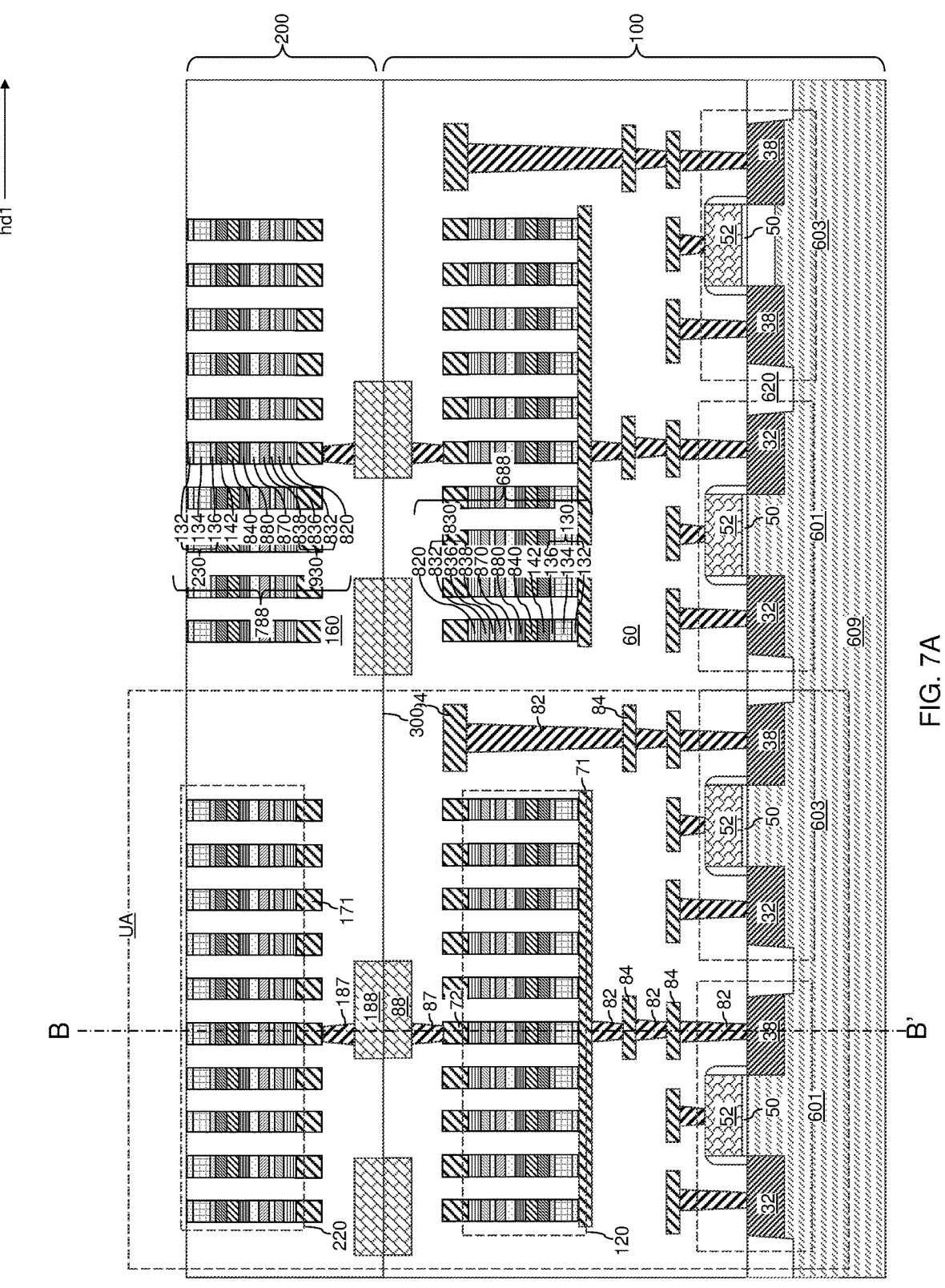
FIG. 7A is a first vertical cross-sectional view of the bonded assembly after removal of the carrier substrate according to an embodiment of the present disclosure.
Figure 7B:
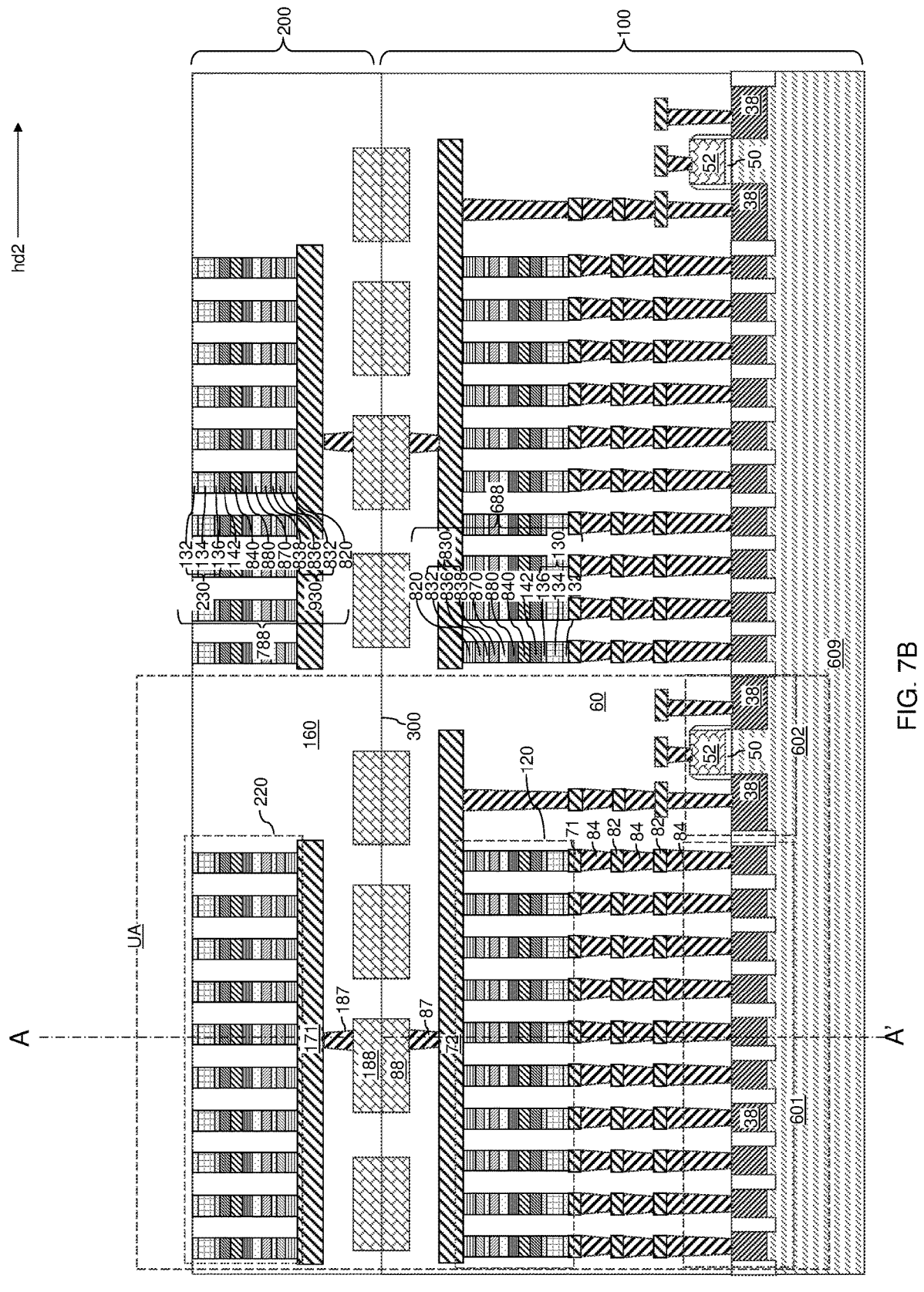
FIG. 7B is a second vertical cross-sectional view of the bonded assembly along the vertical plane B-B' of FIG. 7A. The vertical plane A-A' is the cut plane for the first vertical cross-sectional view of FIG. 7A.

Referring to FIGS. 7A and 7B, the carrier substrate 709 can be removed from the bonded assembly (100, 200). In one embodiment, the release layer 711 can be decomposed or etched away, and the carrier substrate 709 can be detached from the second dielectric material layers 160 of the second memory die 200. In this case, the release layer 711 may be thermally decomposed, decomposed by irradiation by ultraviolet radiation through the carrier substrate 709, or etched away by selective etching (e.g., by using hot phosphoric acid to etch away a silicon nitride release layer 711). Alternatively, the release layer 711 may be omitted, and the carrier substrate 709 can be removed, for example, by grinding, polishing (e.g., by CMP), an anisotropic etch process, and/or an isotropic etch process.

Figure 8A:
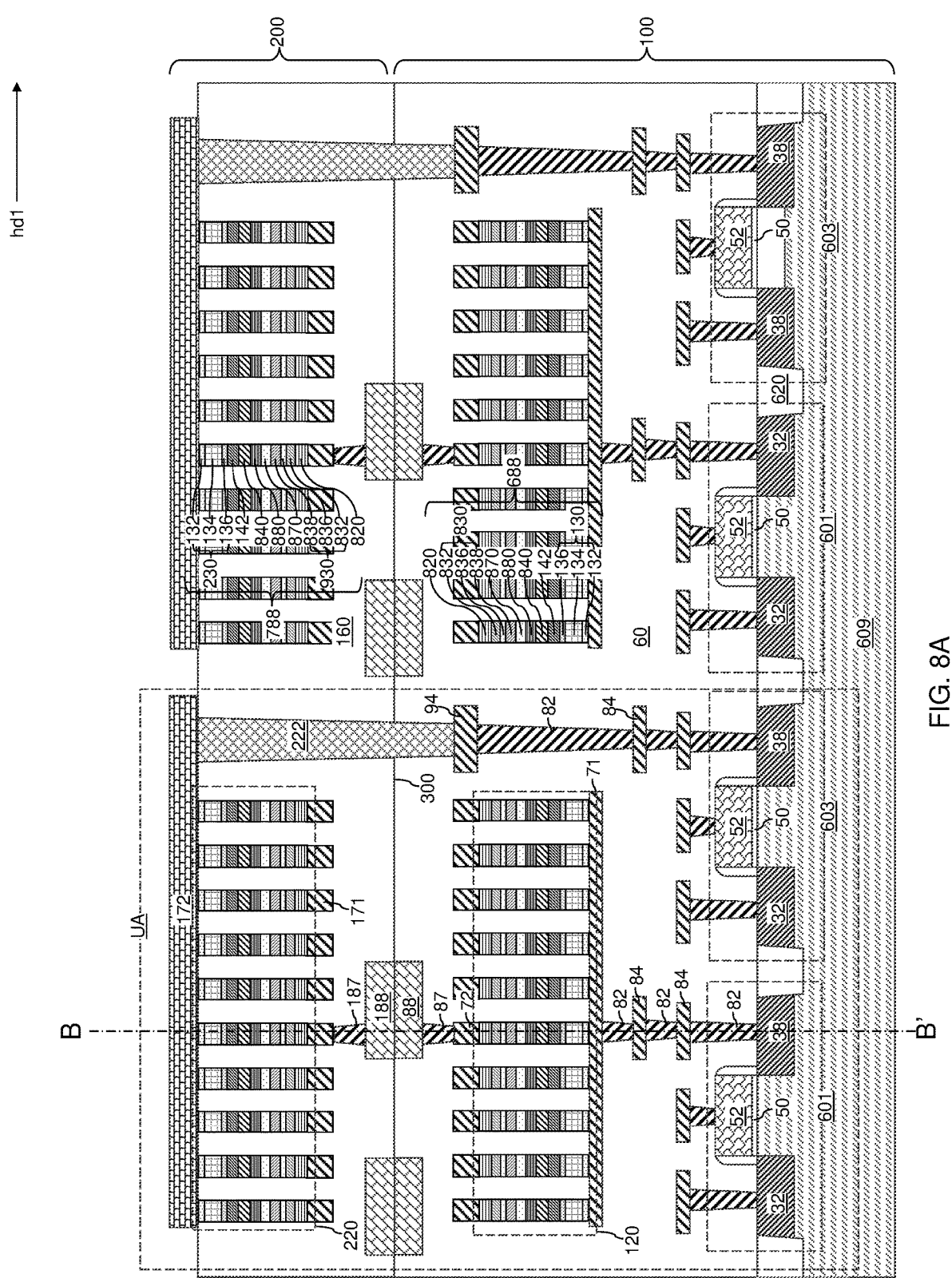
FIG. 8A is a first vertical cross-sectional view of the bonded assembly after formation of connection via structures and fourth access lines according to an embodiment of the present disclosure.
Figure 8B:
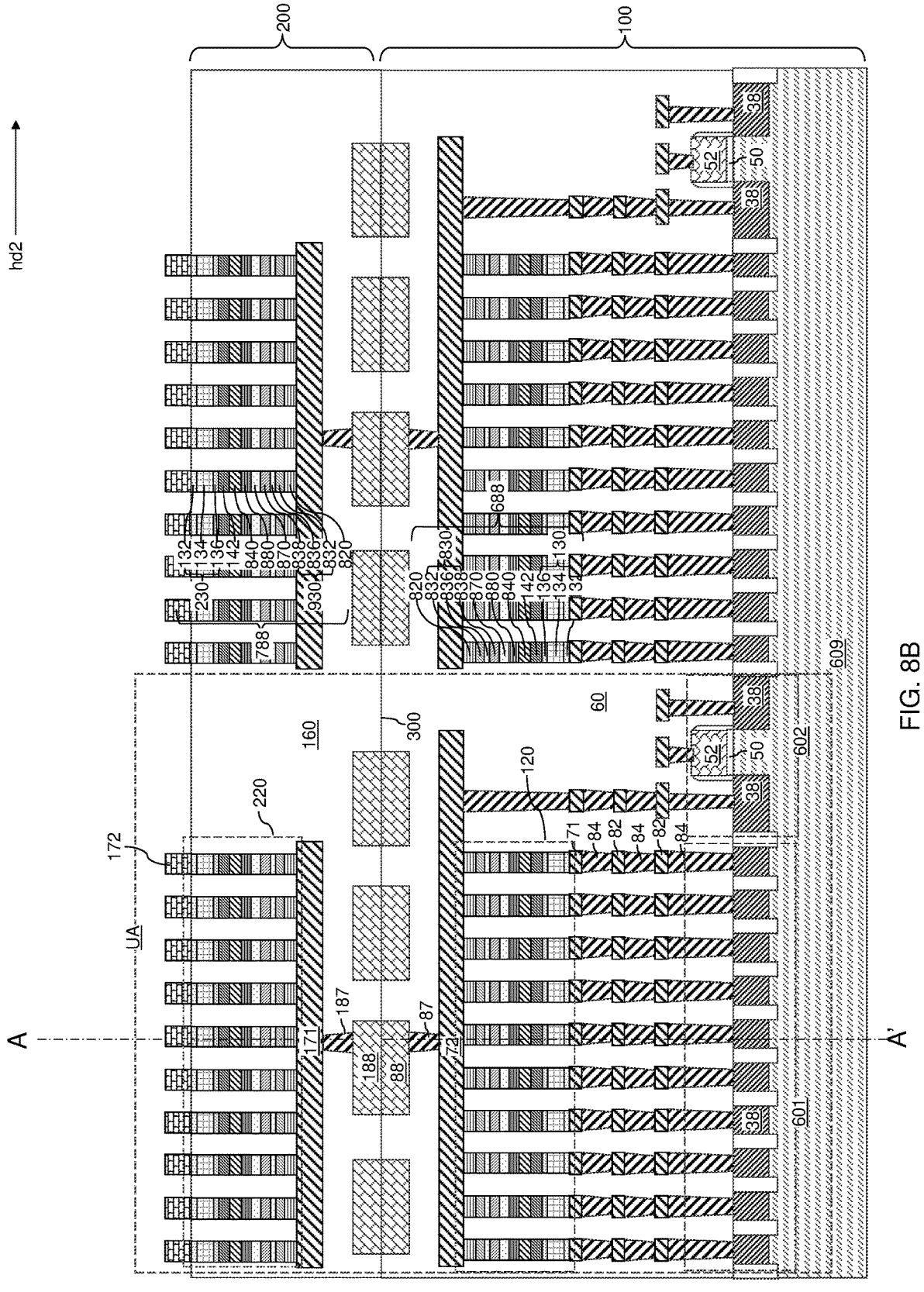
FIG. 8B is a second vertical cross-sectional view of the bonded assembly along the vertical plane B-B' of FIG. 8A. The vertical plane A-A' is the cut plane for the first vertical cross-sectional view of FIG. 8A.

Referring to FIGS. 8A-8B, a photoresist layer (not shown) can be applied over the physically exposed horizontal surface of the second dielectric material layers 160, and can be lithographically patterned to form openings adjacent to a respective one of the second two-dimensional memory arrays 220. An anisotropic etch process can be performed to form connection via cavities that vertically extend through the entirety of the second memory die 200 through the bonding interface 300 and into a proximal portion of the first memory die 100. A top surface of a first metal pad 94 is physically exposed underneath each connection via cavity. Each connection via cavity may have a tapered sidewall. In this case, each connection via cavity may have a variable lateral extent (such as a variable diameter) that increases with a vertical distance from the semiconductor substrate 609. The first photoresist layer can be removed, for example, by ashing.

At least one conductive material (e.g., W, Ta, TiN, etc.) layer, is deposited in the connection via cavities and over the physically exposed horizontal surface of the second dielectric material layers 160. The at least one conductive material is removed from the horizontal surface of the second dielectric material layers 160 by CMP or etch back to form connection via structures 222 electrically contacting the first metal pads 94. Another conductive material layer (e.g., W, Ta, TiN, etc.) is then formed over the connection via structures 222 to form fourth access lines 172 which contact the top surfaces of the connection via structures 222.

Alternatively, the fourth access lines 172 and the connection via structures 222 may be formed during the same deposition and patterning steps. For example, another photoresist layer (not shown) can be applied over the horizontally-extending portion of the at least one conductive material is deposited in the connection via cavities and over the physically exposed horizontal surface of the second dielectric material layers 160. The photoresist layer is lithographically patterned into line patterns that laterally extend along the first horizontal direction hd1. Each line pattern of the second photoresist layer can have an areal overlap with a respective row of second MRAM pillar structures 788 and a respective one of the connection via cavities. An anisotropic etch process can be performed to remove unmasked portions of the at least one conductive material. The second photoresist layer can be removed, for example, by ashing.

Each remaining portion of the at least one conductive material that fills a respective connection via cavity constitutes the connection via structure 222. Each remaining horizontally-extending portion of the at least one conductive material constitutes the fourth access line 172. Thus, each combination of a fourth access line 172 and a connection via structure 222 may be formed as a unitary structure, i.e., a single contiguous structure, such as an integrated line and via structure. Each fourth access line 172 contacts end surfaces of a respective row of second MRAM pillar structures 788. Each fourth access line 172 can be electrically connected to a respective row of second MRAM cells 930 arranged along the first horizontal direction hd1.

In one embodiment, each of the connection via structures 222 may have a variable lateral extent that increases with a vertical distance from the semiconductor substrate 609. Each of the connection via structures 222 may comprise a straight sidewall that vertically extends from a top surface of the respective connection via structure 222 to a bottom surface of the respective connection via structure 222.

In one embodiment, the first memory die 100 comprises a third driver circuit 603 configured to drive the fourth access lines 172 within each unit area UA. If the fourth access lines 172 comprise word lines of the second two-dimensional memory array 220, then the third driver circuit 603 may comprise a word line driver for driving the word lines 172 of the second two-dimensional memory array 220 in the second memory die 200. The bonded assembly (100, 200) comprises second electrically conductive paths (82, 84, 94, 222) electrically connecting each of the fourth access lines 172 to a respective electrical node (e.g., transistor source region 32 or drain region 38) of the third driver circuit 603. In one embodiment, the second electrically conductive paths (82, 84, 94, 222) comprise an array of connection via structures 222 vertically extending through the horizontal interface between the first memory die 100 and the second memory die 200.

In one embodiment, each first two-dimensional memory array 120 of first MRAM cells 830 is embedded within first dielectric material layers 60 in the first memory die 100, and each of the connection via structures 222 is electrically connected via the first metal pad 94 to a respective first metal interconnect structure (82, 84) that is embedded within the first dielectric material layers 60 and is vertically spaced from the horizontal bonding interface 300 between the first memory die 100 and the second memory die 200. In one embodiment, the top surfaces of the first metal pads 94 that are contacted by the connection via structures 222 may be located within the horizontal plane including the top surfaces of the second access lines 72. In one embodiment, bottom surfaces of the connection via structures 222 may be located within the horizontal plane including top surfaces of the second access lines 72.

In one embodiment, top surfaces of the connection via structures 222 can be formed within a horizontal plane including the bottom surfaces of the fourth access lines 172. In one embodiment, the top surfaces of the connection via structures 222 can be located within a horizontal plane including interfaces between the second two-dimensional memory array 220 of third MRAM cells 930 and the fourth access lines 172. In one embodiment, each of the connection via structures 222 comprises a respective straight sidewall that extends from a respective horizontal top surface to a respective horizontal bottom surface.

Figure 9A:
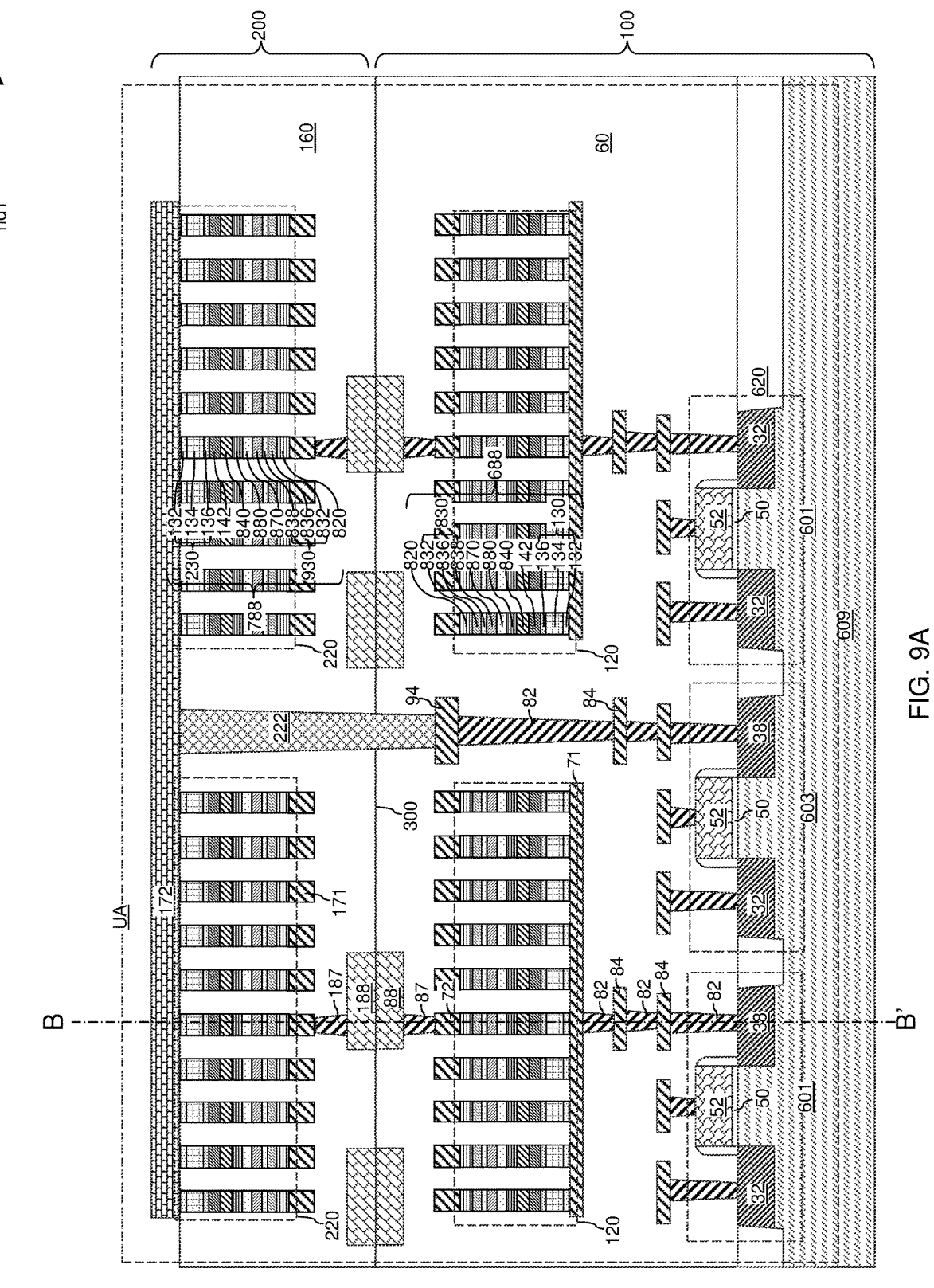
FIG. 9A is a first vertical cross-sectional view of an alternative configuration of the bonded assembly after formation of connection via structures and fourth access lines according to an embodiment of the present disclosure.
Figure 9B:
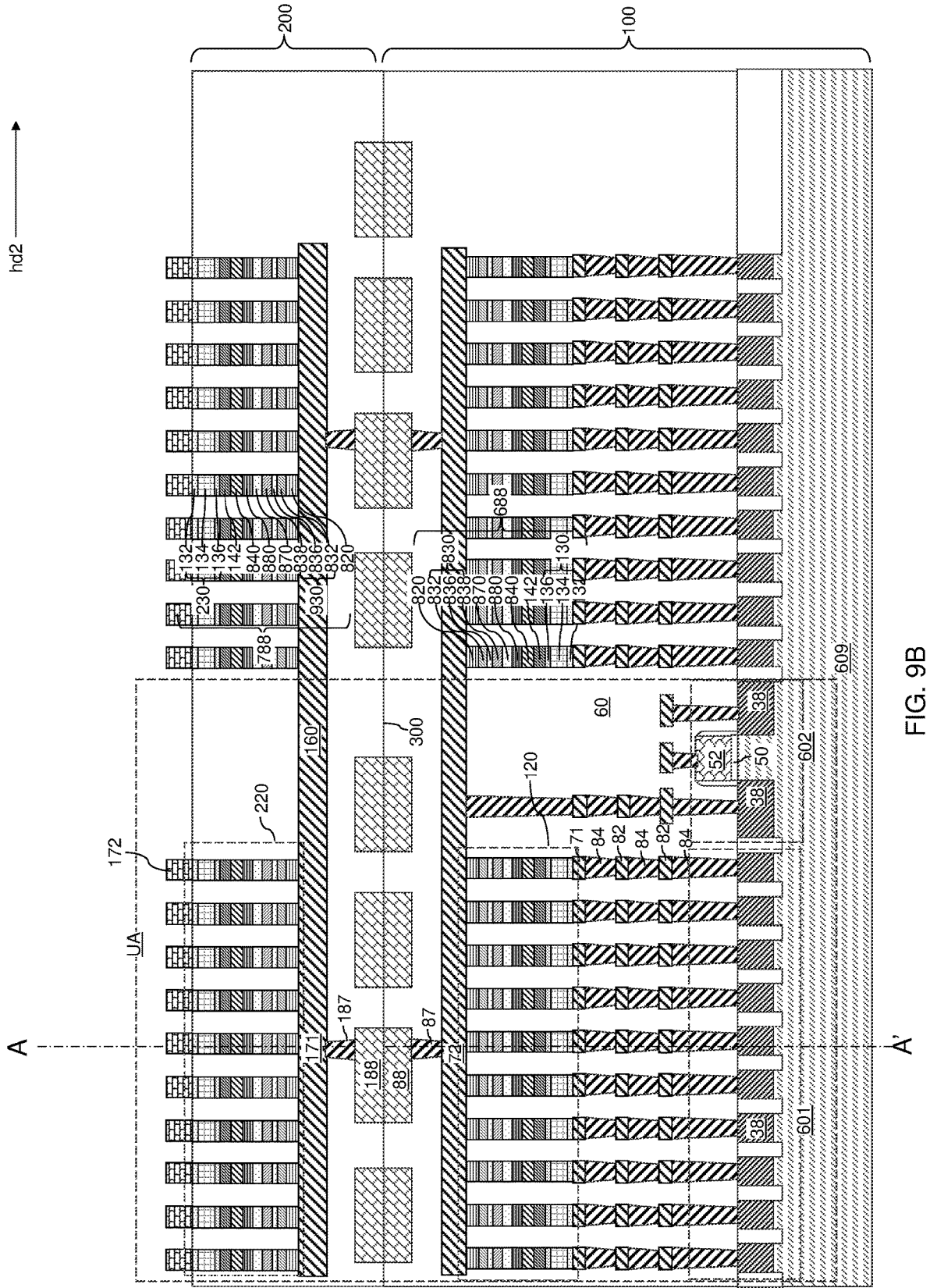
FIG. 9B is a second vertical cross-sectional view of the bonded assembly along the vertical plane B-B' of FIG. 9A. The vertical plane A-A' is the cut plane for the first vertical cross-sectional view of FIG. 9A.

Referring to FIGS. 9A and 9B, an alternative configuration of the bonded assembly (100, 200) is illustrated, which can be derived from the bonded assembly (100, 200) illustrated in FIGS. 8A-8B by forming access lines that extend through two or more two-dimensional memory arrays located in the same vertical level relative to the semiconductor substrate 609. For example, each second access line (e.g., lower bit line) 72 may be electrically connected to a column of first MRAM pillar structures 688 located in two or more first two-dimensional memory arrays 120. Each third access line (e.g., upper bit line) 171 may be electrically connected to a column of second MRAM pillar structures 788 located in two or more second two-dimensional memory arrays 220. Each fourth access line (e.g., upper word line) 172 may be electrically connected to a row of second MRAM pillar structures 788 located in two or more second two-dimensional memory arrays 220. Each pair of second and third access lines (e.g., bit lines) (72, 73) is driven by a respective second driver circuit 602 (e.g., bit line driver). Each fourth access line is driven by a respective third driver circuit 603.

In contrast, in one embodiment, each first access line (e.g., bottom word line) 71 is separate in each respective first two-dimensional memory array 120 and is driven by a respective first driver circuit 601. Thus, separate first driver circuits (e.g., word line drivers) 601 may be used to drive the lower word lines 71 of a respective first two-dimensional memory array 120. However, a respective common driver circuit (602, 603) may be used to drive the respective bit lines (72, 171) and upper word lines 172 which extend through plural two-dimensional memory arrays (120, 220).

Referring to all drawings and according to various embodiments of the present disclosure, a bonded assembly (100, 200) includes a first memory die 100 and a second memory die 200. The first memory die 100 comprises: a first two-dimensional memory array 120 of first MRAM cells 830; first access lines 71 electrically connected to a respective row of first MRAM cells 830 within the first two-dimensional memory array 120; second access lines 72 electrically connected to a respective column of first MRAM cells 830 within the first two-dimensional memory array 120; a first driver circuit 601 configured to drive the first access lines 71; and a second driver circuit 602 configured to drive the second access lines 72 and third access lines 171. The second memory die 200 comprises: a second two-dimensional memory array 220 of second MRAM cells 930; the third access lines 171 electrically connected to a respective column of third MRAM cells 930 within the second two-dimensional memory array 220; and fourth access lines 172 electrically connected to a respective row of third MRAM cells 930 within the second two-dimensional memory array 220. Each of the third access lines 171 is electrically connected to a respective one of the second access lines 72 via first electrically conductive paths that extend through a horizontal bonding interface 300 between the first memory die 100 and the second memory die 200.

In one embodiment, each of the first electrically conductive paths comprises a first metal bonding pad 88 located in the first memory die 100, and a second metal bonding pad 188 located in the second memory die 200 and bonded to the first metal bonding pad 88. In one embodiment, each of the first electrically conductive paths comprises at least one first metal interconnect structure (82, 84, 87) embedded in first dielectric material layers 60 within the first memory die 100 and contacting the first metal bonding pad 88, and at least one second metal interconnect structure 187 embedded in second dielectric material layers 160 within the second memory die 200 and contacting the second metal bonding pad 188.

In one embodiment, a horizontal surface of the first dielectric material layers 60 is bonded to a horizontal surface of the second dielectric material layers 160 via dielectric-to-dielectric bonding. In one embodiment, the at least one first metal interconnect structure (82, 84, 87) comprises a first metal via structure 87 contacting a horizontal surface of one of the second access lines 72; and the at least one second metal interconnect structure 187 comprises a second metal via structure 187 contacting a horizontal surface of one of the third access lines 171.

In one embodiment, the first memory die 100 also comprises a third driver circuit 603 configured to drive the fourth access lines 172; and the bonded assembly (100, 200) also comprises second electrically conductive paths electrically connecting each of the fourth access lines 172 to a respective electrical node (e.g., transistor source region 32 or drain region 38) of the third driver circuit 603. In one embodiment, the second electrically conductive paths comprise an array of connection via structures 222 vertically extending through the horizontal interface. In one embodiment, the first two-dimensional memory array 120 of first MRAM cells 830 is embedded within first dielectric material layers 60 in the first memory die 100; and each of the connection via structures 222 contacts a respective first metal pad 94 that is embedded within the first dielectric material layers 60 and is vertically spaced from the horizontal interface.

In one embodiment, bottom surfaces of the connection via structures 222 are located within a horizontal plane including top surfaces of the second access lines 72. In one embodiment, top surfaces of the connection via structures 222 are located within a horizontal plane including interfaces between the second two-dimensional memory array 220 of third MRAM cells 930 and the fourth access lines 172. In one embodiment, each of the connection via structures 222 comprises a respective straight sidewall that extends from a respective horizontal top surface to a respective horizontal bottom surface. In one embodiment, the first memory die 100 comprises a semiconductor substrate 609; the first driver circuit 601 and the second driver circuit 602 comprise field effect transistors located on the semiconductor substrate 609; and each of the connection via structures 222 has a variable lateral extent that increases with a vertical distance from the semiconductor substrate 609.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Whenever two or more elements are listed as alternatives in a same paragraph of in different paragraphs, a Markush group including a listing of the two or more elements is also impliedly disclosed. Whenever the auxiliary verb "can" is employed in this disclosure to describe formation of an element or performance of a processing step, an embodiment in which such an element or such a processing step is not performed is also expressly contemplated, provided that the resulting apparatus or device can provide an equivalent result. As such, the auxiliary verb "can" as applied to formation of an element or performance of a processing step should also be interpreted as "may" or as "may, or may not" whenever omission of formation of such an element or such a processing step is capable of providing the same result or equivalent results, the equivalent results including somewhat superior results and somewhat inferior results. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. If publications, patent applications, and/or patents are cited herein, each of such documents is incorporated herein by reference in their entirety.

What is claimed is:

1. A bonded assembly of a first memory die and a second memory die, wherein:

the first memory die comprises:
  a first two-dimensional memory array of first MRAM cells;
  first access lines electrically connected to a respective row of first MRAM cells within the first two-dimensional memory array;
  second access lines electrically connected to a respective column of first MRAM cells within the first two-dimensional memory array;
  a first driver circuit configured to drive the first access lines; and
  a second driver circuit configured to drive the second access lines and third access lines; and the second memory die comprises:
  a second two-dimensional memory array of second MRAM cells;
  the third access lines electrically connected to a respective column of second MRAM cells within the second two-dimensional memory array; and
  fourth access lines electrically connected to a respective row of second MRAM cells within the second two-dimensional memory array,
  wherein each of the third access lines is electrically connected to a respective one of the second access lines via first electrically conductive paths that extend through a horizontal bonding interface between the first memory die and the second memory die.

2. The bonded assembly of claim 1, wherein each of the first electrically conductive paths comprises a first metal bonding pad located in the first memory die, and a second metal bonding pad located in the second memory die and bonded to the first metal bonding pad.

3. The bonded assembly of claim 2, wherein each of the first electrically conductive paths comprises at least one first metal interconnect structure embedded in first dielectric material layers within the first memory die and contacting the first metal bonding pad, and at least one second metal interconnect structure embedded in second dielectric material layers within the second memory die and contacting the second metal bonding pad.

4. The bonded assembly of claim 3, wherein a horizontal surface of the first dielectric material layers is bonded to a horizontal surface of the second dielectric material layers via dielectric-to-dielectric bonding.

5. The bonded assembly of claim 3, wherein:
  the at least one first metal interconnect structure comprises a first metal via structure contacting a horizontal surface of one of the second access lines; and
  the at least one second metal interconnect structure comprises a second metal via structure contacting a horizontal surface of one of the third access lines.

6. The bonded assembly of claim 1, wherein:
  the first memory die further comprises a third driver circuit configured to drive the fourth access lines; and the bonded assembly further comprises second electrically conductive paths electrically connecting each of the fourth access lines to a respective electrical node of the third driver circuit.

7. The bonded assembly of claim 6, wherein the second electrically conductive paths comprise connection via structures vertically extending through the horizontal bonding interface.

8. The bonded assembly of claim 7, wherein:
  the first two-dimensional memory array of first MRAM cells is embedded within first dielectric material layers in the first memory die; and
  each of the connection via structures contacts a respective first metal pad that is embedded within the first dielectric material layers and is vertically spaced from the horizontal bonding interface.

9. The bonded assembly of claim 8, wherein:
  bottom surfaces of the connection via structures are located within a horizontal plane including top surfaces of the second access lines; and
  top surfaces of the connection via structures are located within a horizontal plane including interfaces between the second two-dimensional memory array of second MRAM cells and the fourth access lines.

10. The bonded assembly of claim 7, wherein:
  the first memory die further comprises a semiconductor substrate;
  the first driver circuit, the second driver circuit and the third driver circuit comprise field effect transistors located on the semiconductor substrate; and
  each of the connection via structures has a variable lateral extent that increases with a vertical distance from the semiconductor substrate.

11. The bonded assembly of claim 6, wherein:
  each of the second access lines is electrically connected to a column of the first MRAM cells located in two or more of the first two-dimensional memory arrays located in the first memory die;
  each of the third access lines is electrically connected to a column of the second MRAM cells located in two or more of the second two-dimensional memory arrays located in the second memory die;
  each of the fourth access lines is electrically connected to a row of the second MRAM cells located in two or more of the second two-dimensional memory arrays located in the second memory die; and
  each of the first access lines is separate in each respective one of the two or more first two-dimensional memory arrays.

12. The bonded assembly of claim 11, wherein:
  a pair of the second and the third access lines is driven by a respective one of the second driver circuits; and
  each of the first access lines in each respective one of the two or more first two-dimensional memory arrays is driven by a respective different first driver circuit.

13. The bonded assembly of claim 1, wherein:
  each of the first MRAM cells within the first two-dimensional memory array is in a series connection with a respective first selector element in a respective first MRAM pillar structure; and
  each of the second MRAM cells within the second two-dimensional memory array is in a series connection with a respective second elector element in a respective second MRAM pillar structure.

14. The bonded assembly of claim 13, wherein:
  the second MRAM pillar structures are positioned upside down relative to the first MRAM pillar structures; and the first and the second MRAM pillar structures have a mirror symmetry across the horizontal bonding interface.

15. The bonded assembly of claim 14, wherein:

the first MRAM cells comprise spin-transfer torque (STT) MRAM cells comprising a magnetic tunnel junction stack containing a ferromagnetic reference layer, a ferromagnetic free layer and a tunnel barrier layer located between the ferromagnetic reference layer and the ferromagnetic free layer; and the second MRAM cell comprise STT MRAM cells.

\* \* \* \* \*